(12) United States Patent
Kim et al.

(10) Patent No.: US 7,439,581 B2
(45) Date of Patent: Oct. 21, 2008

(54) TRANSISTORS, SEMICONDUCTOR INTEGRATED CIRCUIT INTERCONNECTIONS AND METHODS OF FORMING THE SAME

(75) Inventors: Seong-Goo Kim, Seoul (KR);
Kang-Yoon Lee, Seongnam-si (KR);
Yun-Gi Kim, Yongin-si (KR); Bong-Soo Kim, Sengnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/704,364

(22) Filed: Feb. 9, 2007

(65) Prior Publication Data

US 2008/0061382 A1 Mar. 13, 2008

(30) Foreign Application Priority Data

Sep. 12, 2006 (KR) ...................... 10-2006-0087969

(51) Int. Cl.
*H01L 29/76* (2006.01)
(52) U.S. Cl. .............................. 257/330; 257/E29.201; 438/197; 438/270
(58) Field of Classification Search ................ 438/142, 438/197, 199, 200, 268, 270; 257/213, 284, 257/288, 327, 328, 329, 330, 332, E29.2, 257/E29.26, E29.201, E29.257
See application file for complete search history.

(56) References Cited

U.S. PATENT DOCUMENTS 6,498,071 B2 * 12/2002 Hijzen et al. ................ 438/425

6,835,615 B2   12/2004  Ohtomo
7,005,348 B2    2/2006  Lee
2006/0278921 A1 * 12/2006  Pellizzer et al. ............. 257/328

FOREIGN PATENT DOCUMENTS

KR    10-2006-0053558    5/2006
KR    10-2003-0056914    7/2007

OTHER PUBLICATIONS

Korean Decision of Grant dated Aug. 29, 2007.

* cited by examiner

*Primary Examiner*—Brook Kebede
(74) *Attorney, Agent, or Firm*—Harness, Dickey & Pierce, P.L.C.

(57) ABSTRACT

Provided are transistors, semiconductor integrated circuit interconnections and methods of forming the same. The transistors, semiconductor integrated circuit interconnections and methods of forming the same may improve electrical characteristics between gate electrodes or interconnection electrodes and simplify a semiconductor fabrication process related to gate electrodes or interconnection electrodes. A material layer having first and second regions may be prepared. A trench may be formed in a selected portion of the first region. Transistors or semiconductor integrated circuit interconnections may be in the first and second regions, respectively. One of the transistors or the semiconductor integrated circuit interconnections may be formed in the trench. The transistors or the semiconductor integrated circuit interconnections may be electrically insulated from each other.

28 Claims, 20 Drawing Sheets

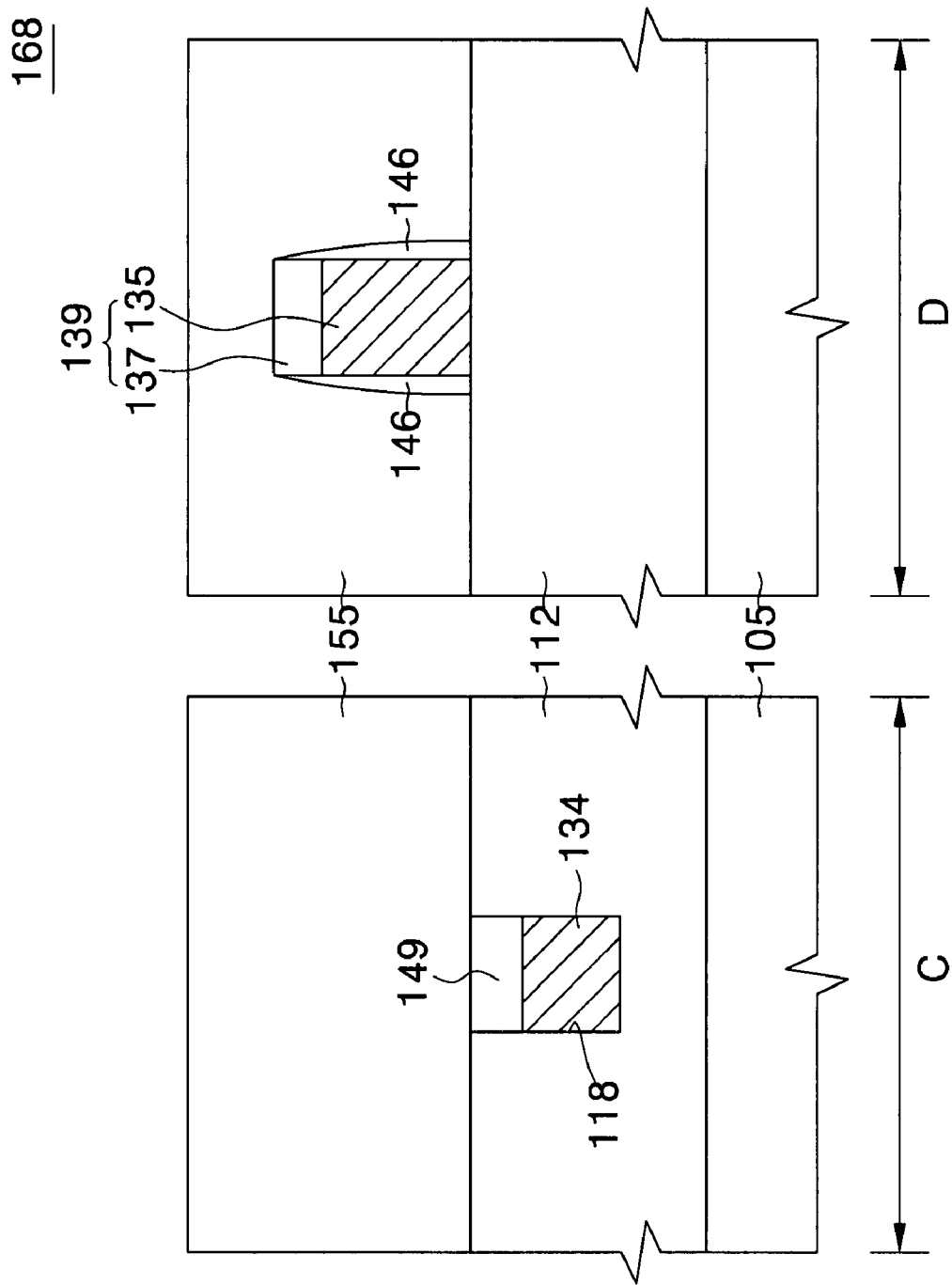

TRANSISTORS, SEMICONDUCTOR INTEGRATED CIRCUIT INTERCONNECTIONS AND METHODS OF FORMING THE SAME

PRIORITY STATEMENT

This application claims priority under 35 USC § 119 to Korean Patent Application No. 2006-87969, filed Sep. 12, 2006, in the Korean Intellectual Property Office (KIPO), the entire contents of which are herein incorporated by reference.

BACKGROUND

1. Field

Example embodiments relate to semiconductor discrete devices, semiconductor integrated circuit interconnections and methods of forming the same. Other example embodiments relate to transistors, semiconductor integrated circuit interconnections and methods of forming the same.

2. Description of Related Art

Transistors or semiconductor integrated circuit interconnections have been recently formed by burying a conductive layer in a trench defined by a material layer according to a gradual reduction of a design rule. The conductive layer may be formed into a buried gate of a transistor or a buried interconnection of a semiconductor integrated circuit interconnection. The material layer may be a semiconductor substrate or an insulating layer on the semiconductor substrate. The buried gate or the buried interconnection may increase the volume thereof in the trench, thereby improving a current driving capability of the transistor or a current transmission capability of the semiconductor integrated circuit interconnection.

However, the buried gate or the buried interconnection makes it difficult to perform a semiconductor fabrication process related to the transistor or the semiconductor integrated circuit interconnection. The residue of the conductive layer may be formed on the material layer during an etching process due to a step difference between a bottom surface of the trench and an upper surface of the material layer while the buried gate or buried interconnection is formed. The buried gate or buried interconnection may be electrically connected to another buried gate or another buried interconnection around the trench through the residue of the conductive layer.

The buried gate constitutes a transistor with electrical nodes and diffusion regions. The electrical nodes may be disposed around the buried gate and contact the diffusion regions. The electrical nodes may contact the buried gate due to gradually reducing the design rule. The electrical nodes may electrically short-circuit the buried gate and diffusion regions.

The conventional buried gate discloses an active region that is defined in a semiconductor substrate. A trench may be formed in the active region, a buried gate may be formed in the trench, and electrical nodes may be formed on the buried gate and the active regions around the buried gate. However, the buried gate may easily contact the electrical nodes of the active regions due to gradually reducing the design rule.

SUMMARY

Example embodiments provide transistors and semiconductor integrated circuit interconnections suitable for improving electrical characteristics and simplifying a semiconductor fabrication process. Example embodiments provide methods of forming transistors and semiconductor integrated circuit interconnections suitable for improving electrical characteristics and simplifying a semiconductor fabrication process.

Example embodiments are directed to a transistor. The transistor may include a semiconductor substrate having first and second active regions. A buried gate may be in a selected portion of the first active region on the semiconductor substrate and may be spaced by a depth from an upper surface of the semiconductor substrate and may extend downward to the semiconductor substrate. A gate pattern may be on a selected portion of the second active region and formed to extend upward from the upper surface of the semiconductor substrate. The gate pattern may have a gate electrode and a gate mask pattern which are sequentially stacked. A gate insulating layer may be on the first and second active regions. The gate insulating layer may encompass the buried gate and may be between the gate pattern and the semiconductor substrate. A gate isolation pattern may cover the upper surface of the buried gate. The gate isolation pattern may be at the same level as the upper surface of the gate insulating layer. Gate spacers may be formed on sidewalls of the gate pattern.

Example embodiments are directed to a semiconductor integrated circuit interconnection. The semiconductor integrated circuit interconnection may include a semiconductor substrate having first and second regions. A molding layer may be on the first and second regions of the semiconductor substrate. A buried interconnection may be in the molding layer of a selected portion of the first region and may be spaced by a depth from the upper surface of the molding layer and may extend downward to the semiconductor substrate. An interconnection pattern may be on the molding layer of a selected portion of the second region and may extend upward from the upper surface of the molding layer. The interconnection pattern may have an interconnection electrode and an interconnection mask pattern which are sequentially stacked. An interconnection isolation pattern may cover the upper surface of the buried interconnection. The interconnection isolation pattern may be formed at substantially the same level as the upper surface of the molding layer. Interconnection spacers may be on sidewalls of the interconnection pattern.

Example embodiments are directed to a method of forming the transistor. The method may include preparing a semiconductor substrate having first and second active regions. A channel trench may be formed in a selected portion of the first active region of the semiconductor substrate. The channel trench may extend downward to a depth from the upper surface of the semiconductor substrate. A gate insulating layer may be formed on the first and second active regions. A buried gate and a gate pattern may be formed on the gate insulating layer. The buried gate may partially fill the channel trench. The gate pattern may be formed on a selected portion of the second active region and may extend upward from the upper surface of the gate insulating layer. The gate pattern may be formed of a gate electrode and a gate mask pattern which are sequentially stacked. A gate isolation pattern may be formed on the upper surface of the buried gate, and gate spacers may be formed on sidewalls of the gate pattern.

Example embodiments are directed to a method of forming the semiconductor integrated circuit interconnection. The method may include preparing a semiconductor substrate having first and second regions. A molding layer may be formed on the first and second regions. A molding trench may be formed in the molding layer. The molding trench may be formed in a selected portion of the first region and may extend downward to a depth from the upper surface of the molding layer. A buried interconnection and an interconnection pattern may be formed on the first and second regions, respectively. The buried interconnection may partially fill the molding trench, and the interconnection pattern may be formed on a selected portion of the second region and may extend upward from the upper surface of the molding layer. The interconnection pattern may be formed of an interconnection electrode and an interconnection mask pattern which are sequentially stacked. An interconnection isolation pattern may be formed on the upper surface of the buried interconnection, and interconnection spacers may be formed on sidewalls of the interconnection pattern.

BRIEF DESCRIPTION OF THE DRAWINGS

Example embodiments will be more clearly understood from the following detailed description taken in conjunction with the accompanying drawings. FIGS. 1-20 represent non-limiting, example embodiments as described herein.

FIGS. 1 and 2 illustrate a layout view showing a transistor and a semiconductor integrated circuit interconnection according to example embodiments, respectively.

FIGS. 3 and 4 are cross-sectional views showing a transistor and a semiconductor integrated circuit interconnection taken along lines I-I' and II-II' of FIGS. 1 and 2, respectively.

FIGS. 5, 7, 9, 11 and 13 respectively are cross-sectional views taken along line I-I' of FIG. 1, illustrating a method of forming a transistor according to example embodiments.

FIGS. 6, 8, 10, 12 and 14 respectively are cross-sectional views taken along line II-II' of FIG. 2, illustrating a method of forming a semiconductor integrated circuit interconnection according to example embodiments.

FIGS. 15, 17 and 19 respectively are cross-sectional views taken along line I-I' of FIG. 1, illustrating a method of forming a transistor according to example embodiments.

FIGS. 16, 18 and 20 respectively are cross-sectional views taken along line II-II' of FIG. 2, illustrating a method of forming a semiconductor integrated circuit interconnection according to example embodiments.

DETAILED DESCRIPTION OF EXAMPLE EMBODIMENTS

Figure 1:
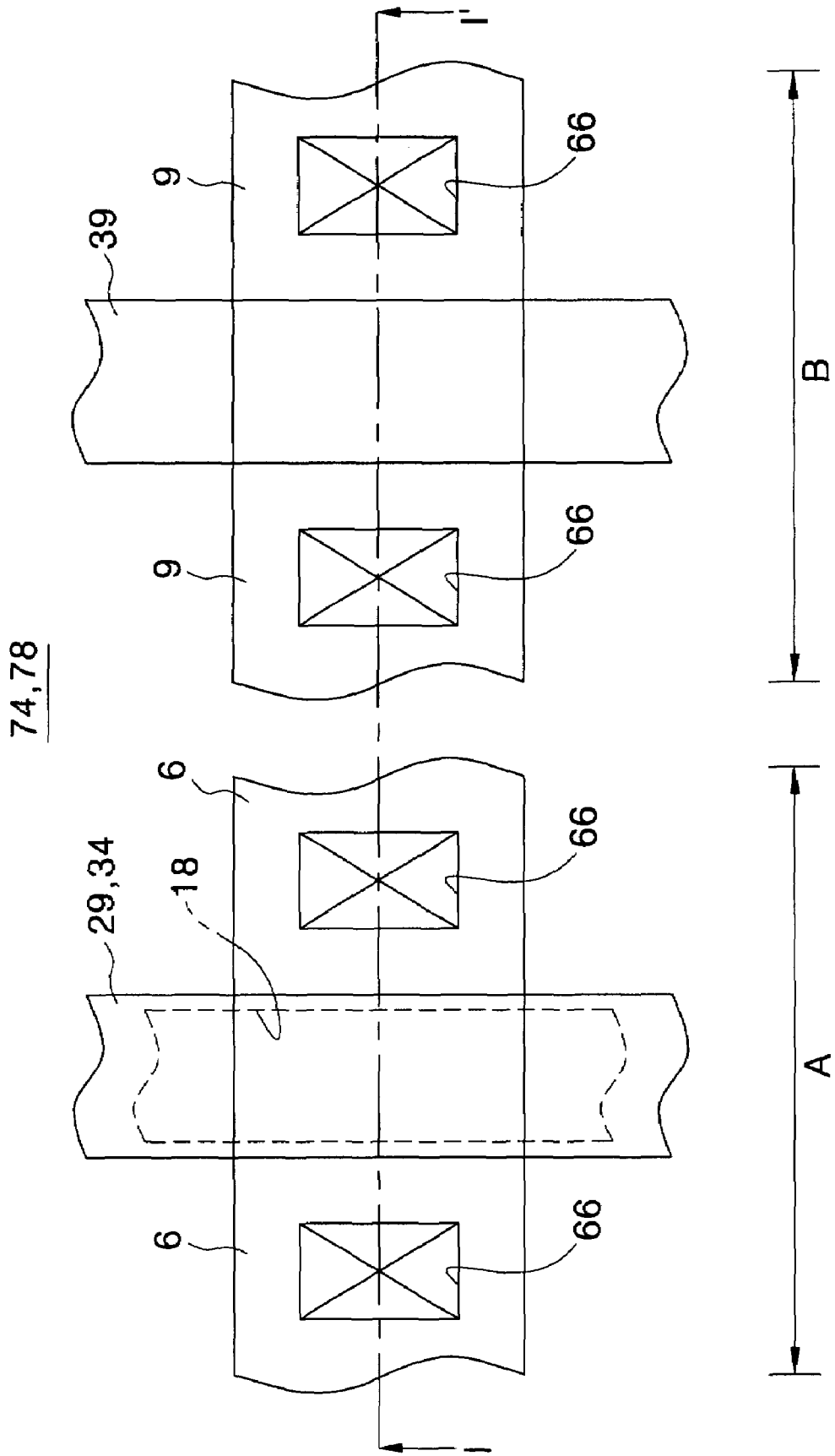

Transistors and semiconductor integrated circuit interconnections of example embodiments will now be described more fully hereinafter with reference to the accompanying drawings, in which example embodiments are shown. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
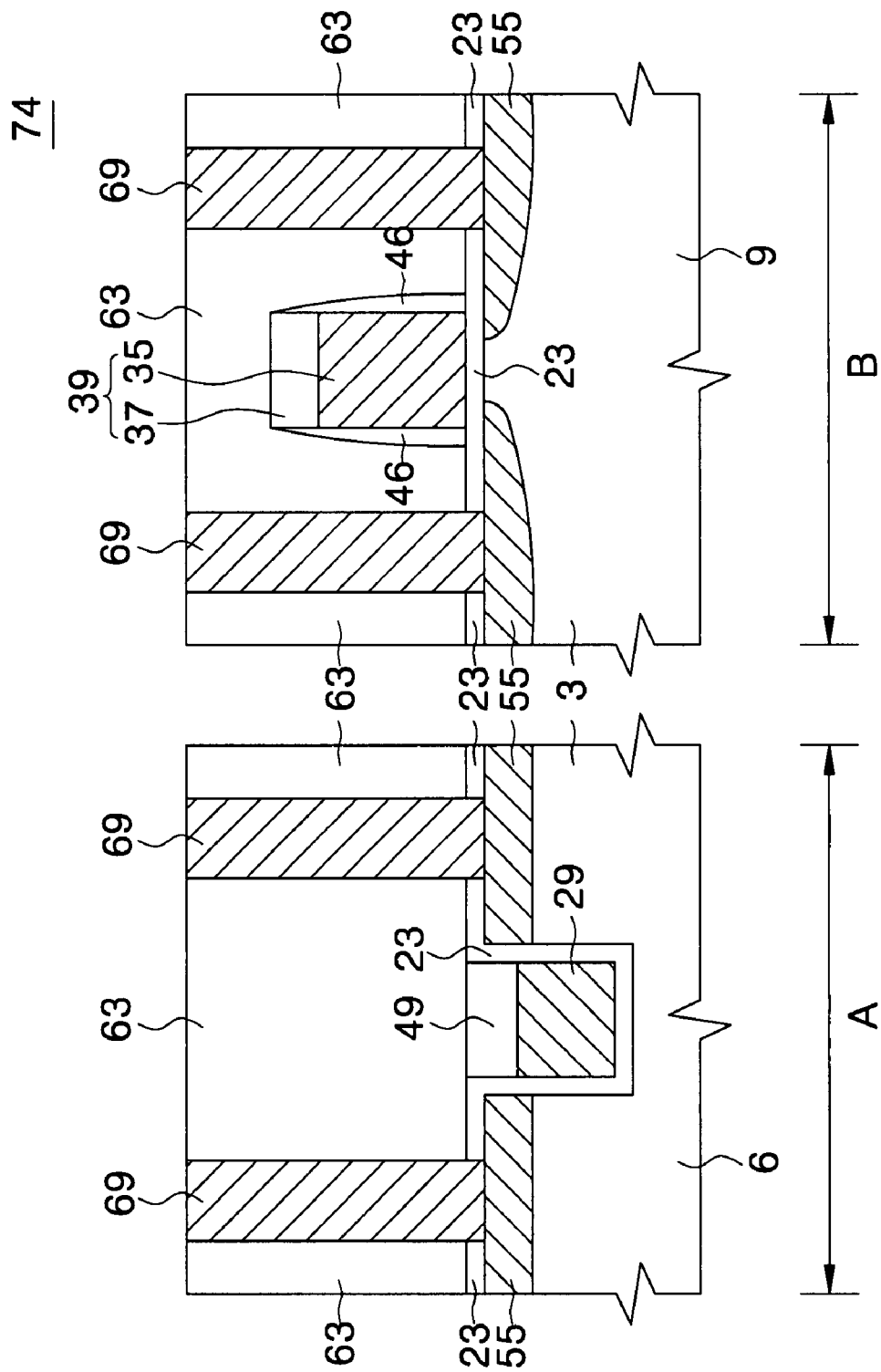

FIG. 1 illustrates a layout view showing a transistor according to example embodiments, and FIG. 3 is a cross-sectional view showing a transistor taken along line I-I' of FIG. 1.

Referring to FIGS. 1 and 3, transistors 74 according to example embodiments may include a semiconductor substrate 3 having two regions A and B. First and second active regions 6 and 9 may be disposed in the regions A and B of the semiconductor substrate 3, respectively. The semiconductor substrate 3 may have N or P-type conductivity. The regions A and B of the semiconductor substrate 3 may be a cell array region and a peripheral circuit region, respectively. The regions A and B of the semiconductor substrate 3 may be disposed adjacent to each other along a boundary of an upper surface of the semiconductor substrate 3.

A buried gate 29 may be disposed in the semiconductor substrate 3. The buried gate 29 may be disposed in a selected portion of the first active region 6. The buried gate 29 may be spaced by a predetermined or given depth from the upper surface of the semiconductor substrate 3 and may extend downward to the semiconductor substrate 3. A gate pattern 39 may be disposed on the semiconductor substrate 3. The gate pattern 39 may be disposed on a selected portion of the second active region 9. The gate pattern 39 may extend upward from the upper surface of the semiconductor substrate 3.

The gate pattern 39 may include a gate electrode 35 and a gate mask pattern 37 which are sequentially stacked. The gate mask pattern 37 may include material having a different etch rate from the gate electrode 35. The gate mask pattern 37 may be formed of silicon oxide and/or silicon nitride. The gate mask pattern 37 may be a material having at least one of metal and non-metal atoms in a lattice of silicon oxide. The gate electrode 35 may include different conductive material from the buried gate 29. The buried gate 29 may be formed of doped polysilicon, metal nitride and/or a combination thereof. The gate electrode 35 may be formed of doped polysilicon, metal nitride and/or a combination thereof.

Alternatively, the buried gate 29 and the gate electrode 35 may include the same conductive material. The buried gate 29 and the gate electrode 35 may be doped polysilicon, metal nitride and/or a combination thereof. A gate insulating layer 23 may be disposed on the first and second active regions 6 and 9. The gate insulating layer 23 may encompass the buried gate 29 and interposed or inserted between the gate pattern 39 and the semiconductor substrate 3. The gate insulating layer 23 may be formed of silicon oxide. The gate insulating layer 23 may be formed of a material having at least one of metal and non-metal atoms in a lattice of silicon oxide.

A gate isolation pattern 49 may be disposed on the upper surface of the buried gate 29. The gate isolation pattern 49 may be disposed at substantially the same level as the upper surface of the gate insulating layer 23. Sidewalls of the gate pattern 39 may be covered by gate spacers 46. The gate spacers 46 and the gate isolation pattern 49 may be formed of silicon oxide or silicon nitride. The gate isolation pattern 49, the gate spacers 46 and the gate mask pattern 37 may include the same material. Alternatively, the gate mask pattern 37, the gate spacers 46 and the gate isolation pattern 49 may include different materials from one another.

Diffusion regions 55 may be disposed on the semiconductor substrate 3 to overlap the buried gate 29 and the gate pattern 39. The diffusion regions 55 may have the same conductivity type as the semiconductor substrate 3. Alternatively, the diffusion regions 55 may have a different conductivity type from the semiconductor substrate 3. A planarization insulating layer 63 may be disposed on the gate insulating layer 23 to cover the gate pattern 39, the gate spacers 46 and the gate isolation pattern 49. The planarization insulating layer 63 may be silicon oxide. The planarization insulating layer 63 may also be a material having at least one of metal and non-metal atoms in a lattice of silicon oxide.

Electrical nodes 69 may be disposed adjacent to the buried gate 29 and the gate pattern 39 through the planarization insulating layer 63 and the gate insulating layer 23. The electrical nodes 69 may contact the diffusion regions 55, respectively. The electrical nodes 69 may be conductive material. The electrical nodes 69 and the buried gate 29 may be insulated from each other by the gate isolation pattern 49 in the first active region 6.

Figure 2:
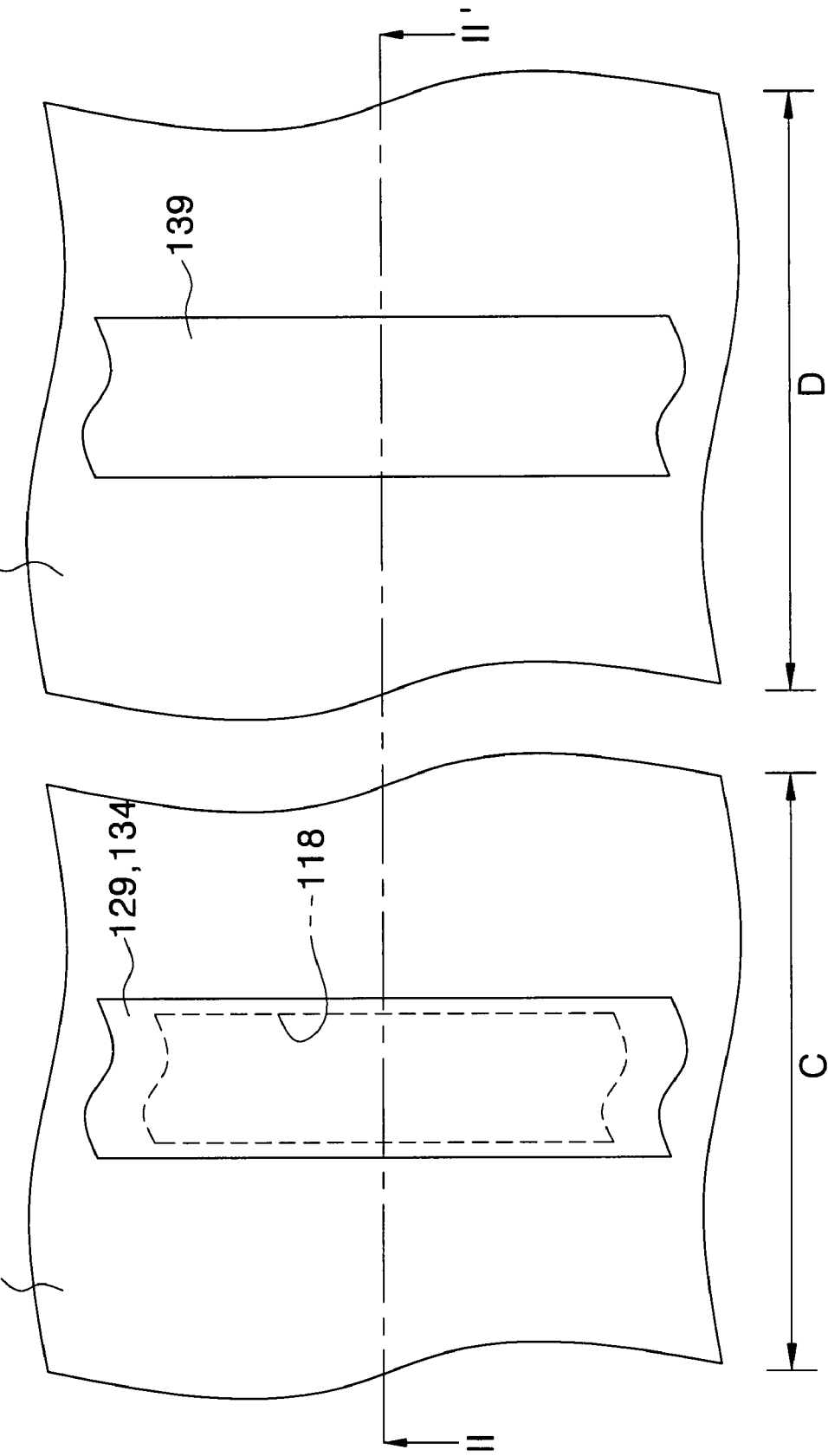

Semiconductor integrated circuit interconnections of example embodiments will be described with reference to FIGS. 2 and 4. FIG. 2 illustrates a layout view showing a semiconductor integrated circuit interconnection according to example embodiments, and FIG. 4 is a cross-sectional view showing a semiconductor integrated circuit interconnection taken along line II-II' of FIG. 2.

Figure 4:
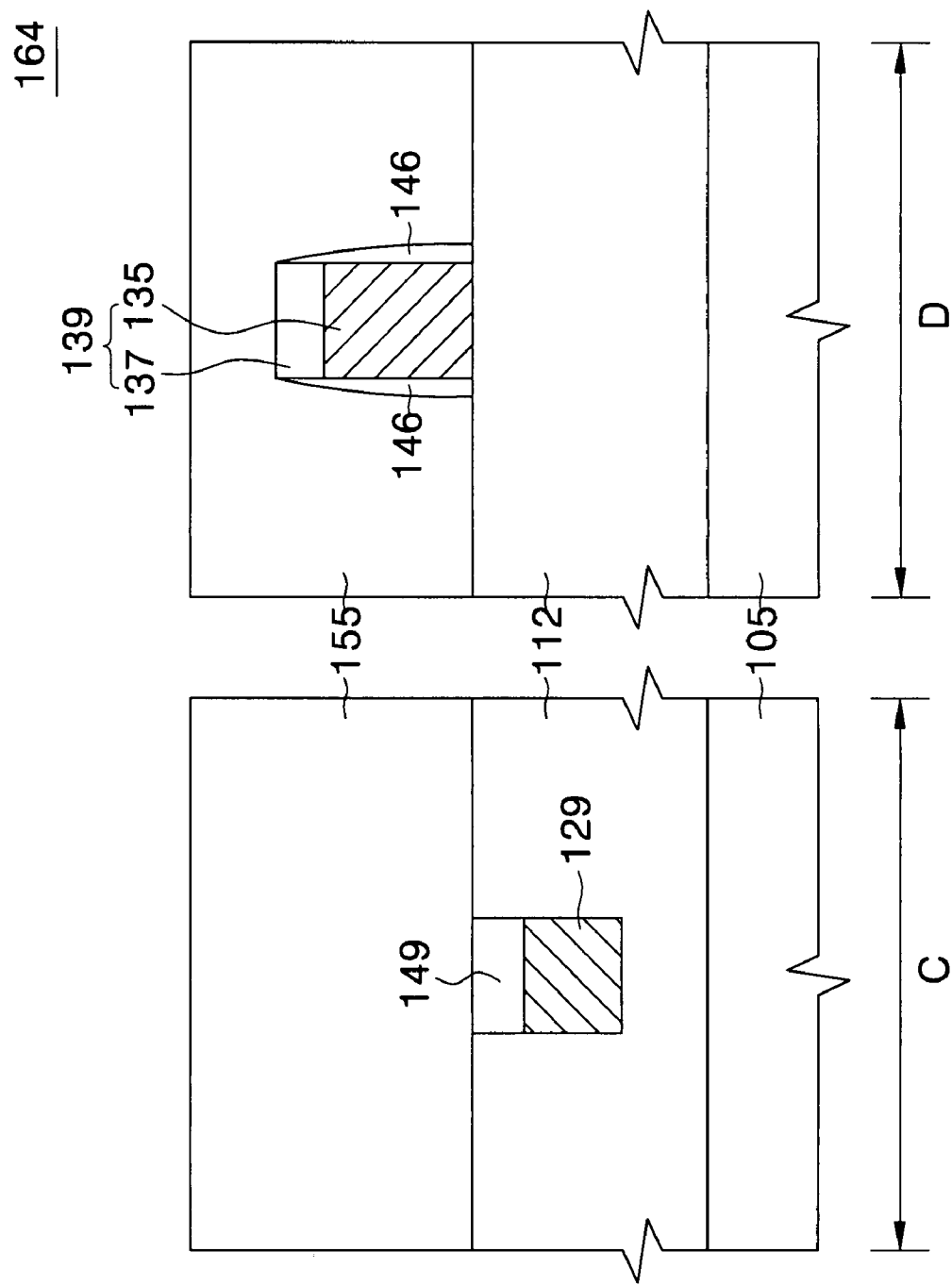

Referring to FIGS. 2 and 4, semiconductor integrated circuit interconnections 164 according to example embodiments may include a semiconductor substrate 105 having first and second regions C and D. The semiconductor substrate 105 may have N or P-type conductivity. The first and second regions C and D may be a cell array region and a peripheral circuit region, respectively. The first and second regions C and D may be disposed adjacent to each other along a boundary of an upper surface of the semiconductor substrate 105.

A molding layer 112 may be disposed on the first and second regions C and D. The molding layer 112 may be silicon oxide. The molding layer 112 may also be a material having at least one of metal and non-metal atoms in a lattice of silicon oxide. A buried interconnection 129 may be disposed in the molding layer 112. The buried interconnection 129 may be disposed in a selected portion of the first region C. The buried interconnection 129 may be spaced by a predetermined or given depth from an upper surface of the molding layer 112 and may extend downward to the semiconductor substrate 115. An interconnection pattern 139 may be disposed on the molding layer 112. The interconnection pattern 139 may be disposed on a selected portion of the second region D. The interconnection pattern 139 may extend upward from the upper surface of the molding layer 112.

The interconnection pattern 139 may include an interconnection electrode 135 and an interconnection mask pattern 137 which are sequentially stacked. The interconnection mask pattern 137 may include a material having a different etch rate from the interconnection electrode 135. The interconnection mask pattern 137 may be silicon oxide and/or silicon nitride. The interconnection mask pattern 137 may also be a material having at least one of metal and non-metal atoms in a lattice of silicon oxide. The interconnection electrode 135 may include a different conductive material from the buried interconnection 129. The buried interconnection 129 may be formed of doped polysilicon, metal nitride and/or a combination thereof. The interconnection electrode 135 may be formed of doped polysilicon, metal nitride and/or a combination thereof.

Alternatively, the buried interconnection 129 and the interconnection electrode 135 may include the same conductive material. The buried interconnection 129 and the interconnection pattern 139 may be doped polysilicon, metal nitride and/or a combination thereof. An interconnection isolation pattern 149 may be disposed on the buried interconnection 129. The interconnection isolation pattern 149 may be disposed at substantially the same level as the upper surface of the molding layer 112. Sidewalls of the Interconnection pattern 139 may be covered by interconnection spacers 146, respectively. The interconnection spacers 146 and the interconnection isolation pattern 149 may be silicon oxide and/or silicon nitride. The interconnection isolation pattern 149, the interconnection spacers 146 and the interconnection mask pattern 137 may include the same material. Alternatively, the interconnection mask pattern 137, interconnection spacers 146 and interconnection isolation pattern 149 may include different materials.

A passivation insulating layer 155 may be disposed on the molding layer 112. The passivation insulating layer 155 may cover the interconnection isolation pattern 149, the interconnection spacers 146 and the interconnection pattern 139. The passivation insulating layer 155 may be silicon oxide. The passivation insulating layer 155 may include a material having at least one of metal and non-metal atoms in a lattice of silicon oxide. The interconnection pattern 139 and the buried interconnection 129 may be insulated from each other by the interconnection isolation pattern 149 in the first region C.

Methods of forming transistors and semiconductor integrated circuit interconnections according to example embodiments will be described with reference to the remaining accompanying drawings. To begin with, example embodiments of a method of forming the transistors will be described with reference to FIGS. 5, 7, 9, 11 and 13. FIGS. 5, 7, 9, 11 and 13 respectively are cross-sectional views taken along line I-I' of FIG. 1, illustrating a method of forming a transistor according to example embodiments.

Figure 5:
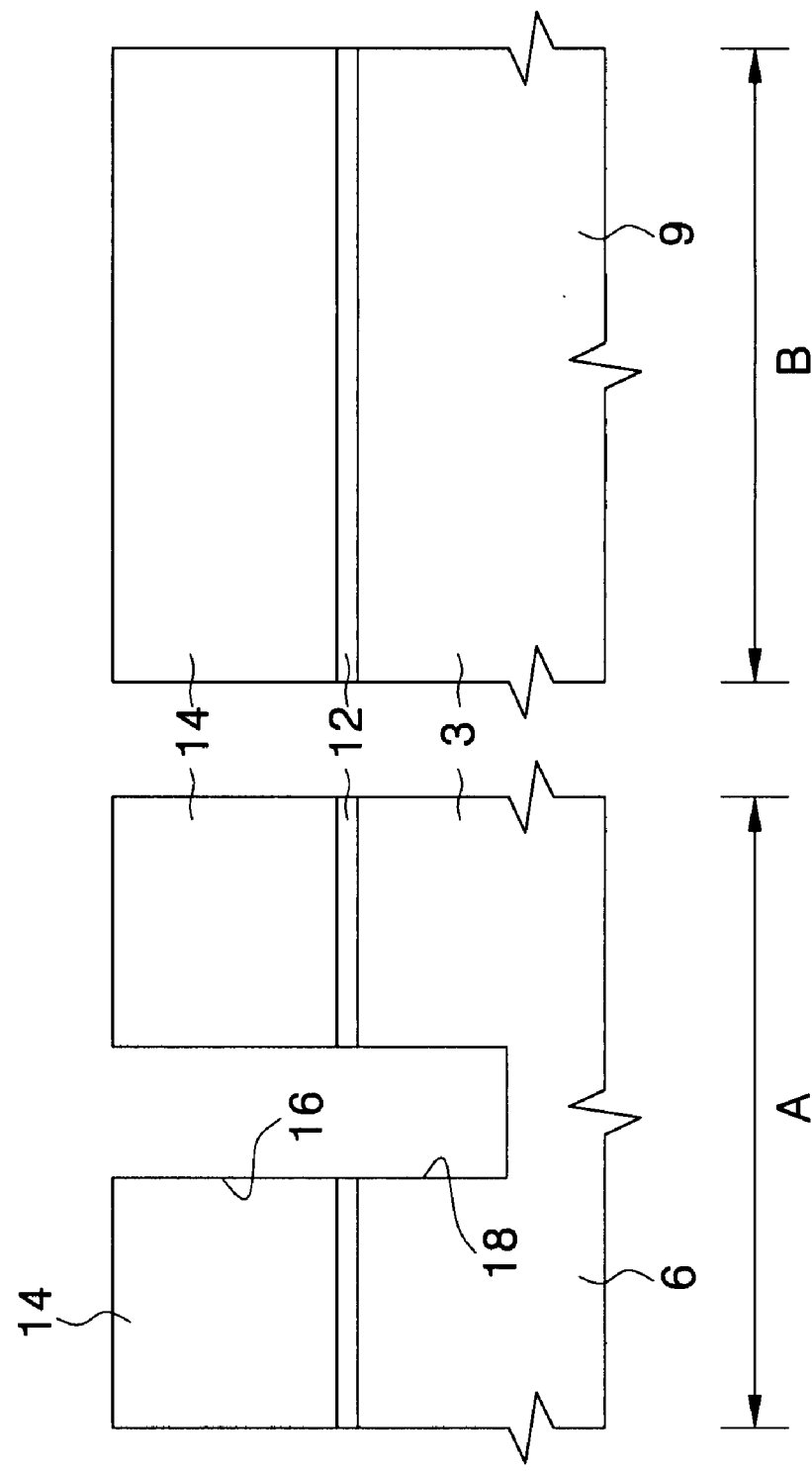

Referring to FIGS. 1 and 5, a semiconductor substrate 3 having two regions A and B may be prepared as shown in FIG. 1 or 5. First and second active regions 6 and 9 may be formed in the semiconductor substrate 3 as shown in FIG. 1 or 5. The first and second active regions 6 and 9 may be defined in the semiconductor substrate 3 by a non-active region (not shown in the drawings). The non-active region may be formed by using a well-known local oxidation of silicon (LOCOS) process and/or shallow trench isolation (STI) process. The semiconductor substrate 3 may have N or P-type conductivity. The two regions A and B of the semiconductor substrate 3 may be a cell array region and a peripheral circuit region, respectively. The two regions A and B of the semiconductor substrate 3 may be formed adjacent to each other along a boundary of an upper surface of the semiconductor substrate 3.

Referring back to FIGS. 1 and 5, a pad layer 12 and a buffer layer 14, which are sequentially stacked, may be formed on the first and second active regions 6 and 9 as shown in FIG. 5. The buffer layer 14 may have a hole 16 on a selected portion of the first active region 6. The pad layer 12 and the buffer layer 14 may be formed of material having a different etch rate from the semiconductor substrate 3. The buffer layer 14 may be formed of photoresist. The pad layer 12 may be formed of silicon oxide. Using the buffer layer 14 as an etching mask, the pad layer 12 and the semiconductor substrate 3 may be sequentially etched, and thereby a channel trench 18 may be formed as shown in FIG. 1 or 5.

In order to form the channel trench 18, the pad layer 12 and the buffer layer 14 may be formed of silicon oxide and silicon nitride, respectively. A photoresist layer may be formed on the buffer layer 14. The photoresist layer may have a through portion on the selected portion of the first active region 6. The through portion may expose the buffer layer 14. The through portion of the photoresist layer may be formed by using a well-known semiconductor photolithography process.

Using the photoresist layer as an etching mask and the pad layer 12 as an etch-stop layer, the buffer layer 14 may be etched, which allows the buffer layer 14 to have the hole 16 as shown in FIG. 5. The photoresist layer may be removed from the semiconductor substrate 3. Using the buffer layer 14 as an etching mask, the pad layer 12 and the semiconductor substrate 3 may be sequentially etched, so that the channel trench 18 may be formed. The channel trench 18 may be disposed in the selected portion of the first active region 6 and may extend downward to have a predetermined or given depth from the upper surface of the semiconductor substrate 3.

Figure 7:
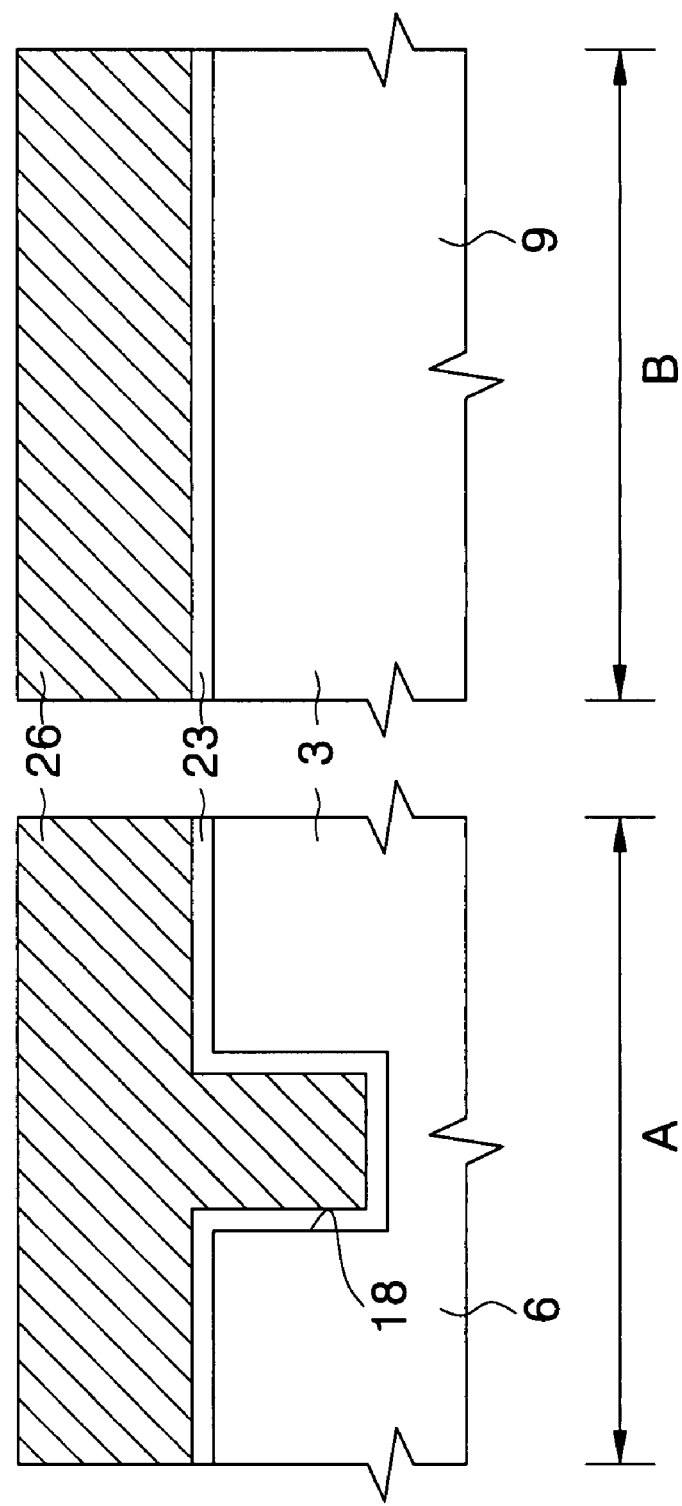

Referring to FIGS. 1 and 7, the buffer layer 14 and the pad layer 12 may be sequentially removed from the first and second active regions 6 and 9. A gate insulating layer 23 may be simultaneously formed on the first and second active regions 6 and 9. The gate insulating layer 23 may cover the channel trench 18. The gate insulating layer 23 may be formed of silicon oxide. The gate insulating layer 23 may be formed of a material having at least one of metal and non-metal atoms in a lattice of silicon oxide. A buried gate layer 26 may fill the channel trench 18 and cover the gate insulating layer 23. The buried gate layer 26 may be formed of conductive material. The buried gate layer 26 may be formed of doped polysilicon, metal nitride and/or a combination thereof.

Figure 9:
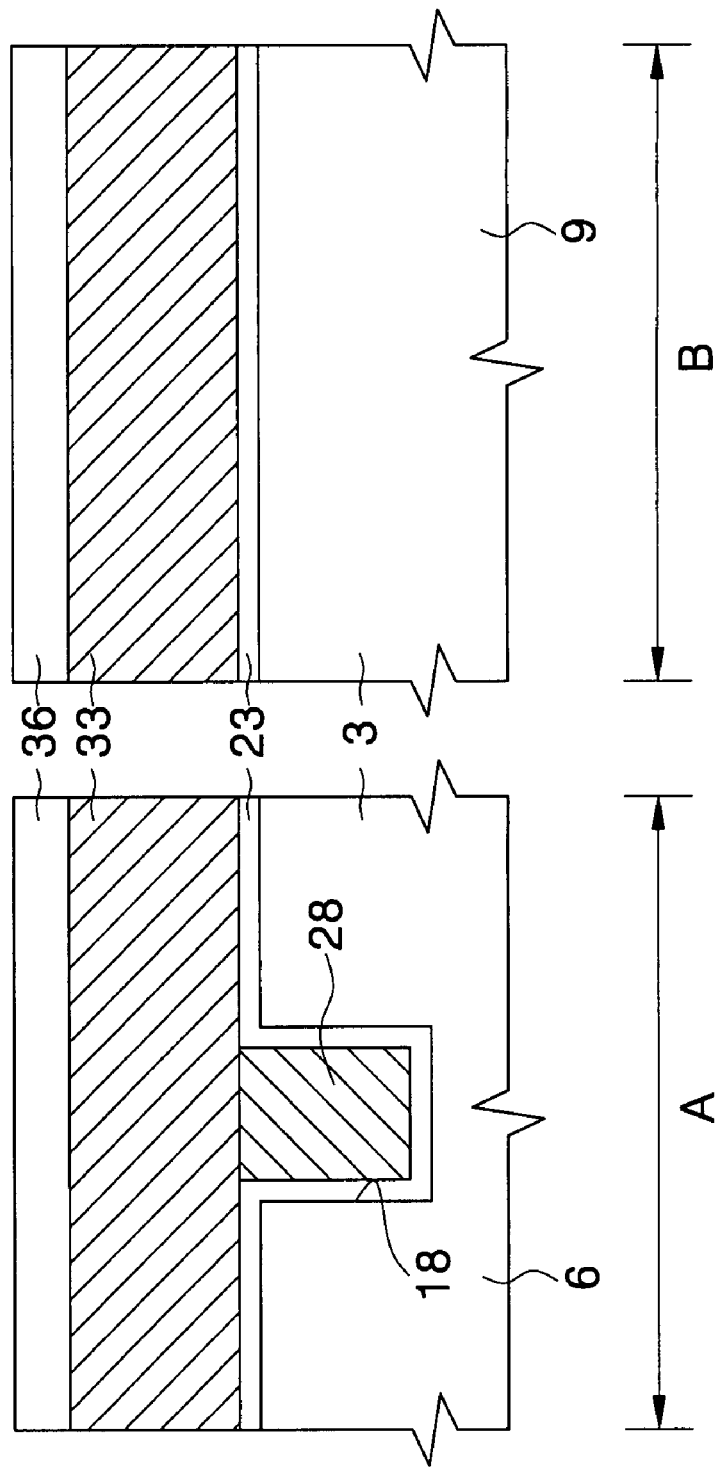

Referring to FIGS. 1 and 9, the buried gate layer 26 may be blanket-etched until the gate insulating layer 23 is exposed, and thereby a preliminary buried gate 28 may be formed as shown in FIG. 9. The preliminary buried gate 28 may sufficiently fill the channel trench 18. A gate conductive layer 33 and a gate mask layer 36, which are sequentially stacked on the first and second active regions 6 and 9, may cover the preliminary buried gate 28. The gate mask layer 36 may be formed of silicon oxide and/or silicon nitride. The gate mask layer 36 may be formed of a material having at least one of metal and non-metal atoms in a lattice of silicon oxide. The gate conductive layer 33 may be formed of a conductive material. The gate conductive layer 33 may be formed of doped polysilicon, metal nitride and/or a combination thereof.

Figure 11:
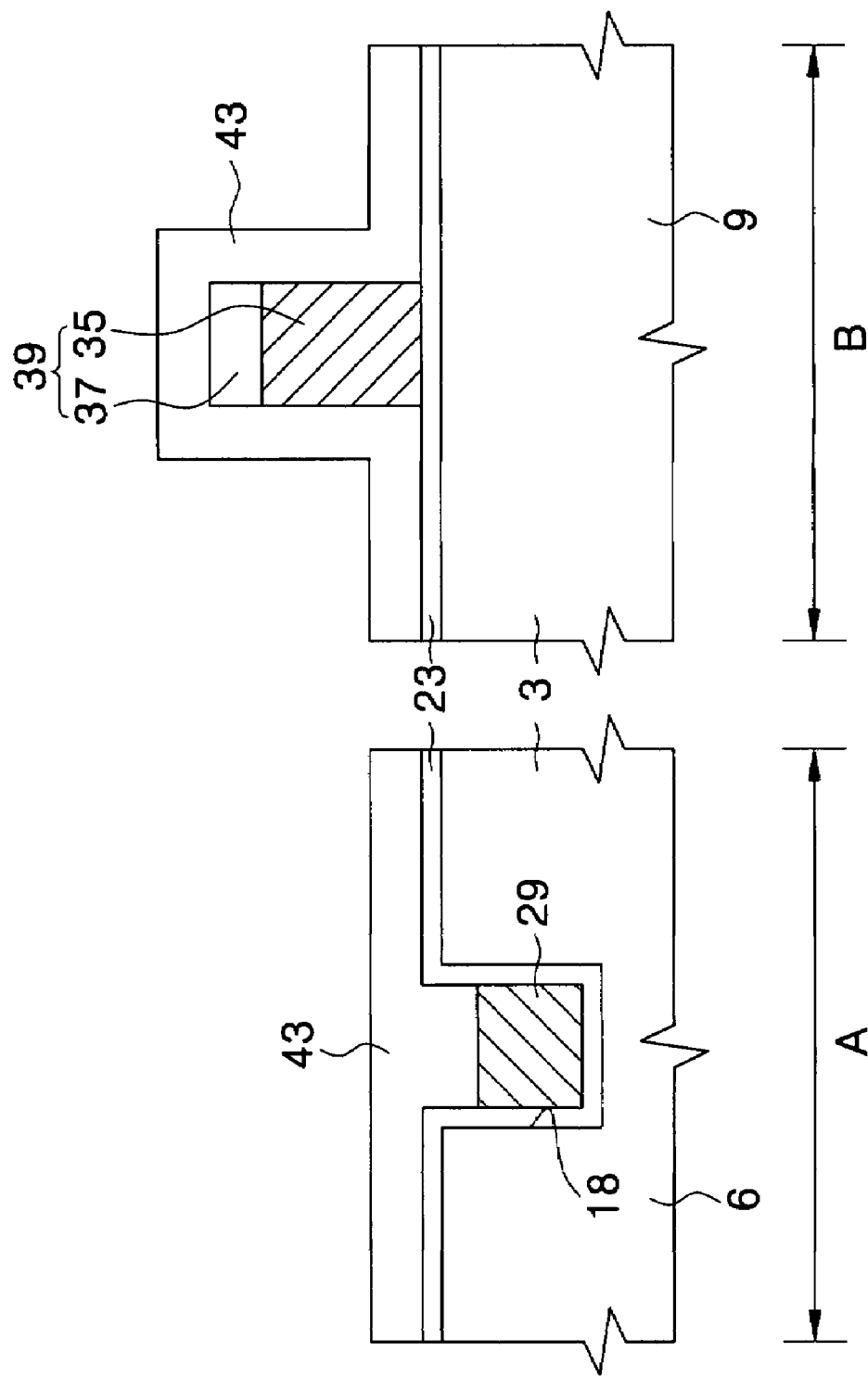

Referring to FIGS. 1 and 11, a photoresist pattern may be formed on the gate mask layer 36 to be disposed on a selected portion of the second active region 9. The photoresist pattern may be formed by using a well-known semiconductor photolithography process. Using the photoresist pattern as an etching mask, the gate mask layer 36 and the gate conductive layer 33 may be sequentially etched until the gate insulating layer 23 is exposed. While the gate mask layer 36 and the gate conductive layer 33 are etched, the preliminary buried gate 28 may be simultaneously and partially etched to form a buried gate 29 as shown in FIG. 1 or 11. The buried gate 29 may partially fill the channel trench 18. The photoresist pattern may be removed from the semiconductor substrate 3.

A gate pattern 39 may be formed on the second active region 9 with the buried gate 29 as shown in FIG. 1 or 11. The gate pattern 39 may be disposed on the selected portion of the second active region 9 and may extend upward from an upper surface of the gate insulating layer 23. The gate pattern 39 may have a gate electrode 35 and a gate mask pattern 37 which are sequentially stacked. Alternatively, the gate electrode 35 and the buried gate 29 may be formed of different conductive materials. The gate electrode 35 and the buried gate 29 may be formed of the same conductive material. A gate isolation layer 43 may be formed on the gate insulating layer 23 to cover the buried gate 29 and the gate pattern 39. The gate isolation layer 43 may be formed of silicon oxide and/or silicon nitride.

Figure 13:
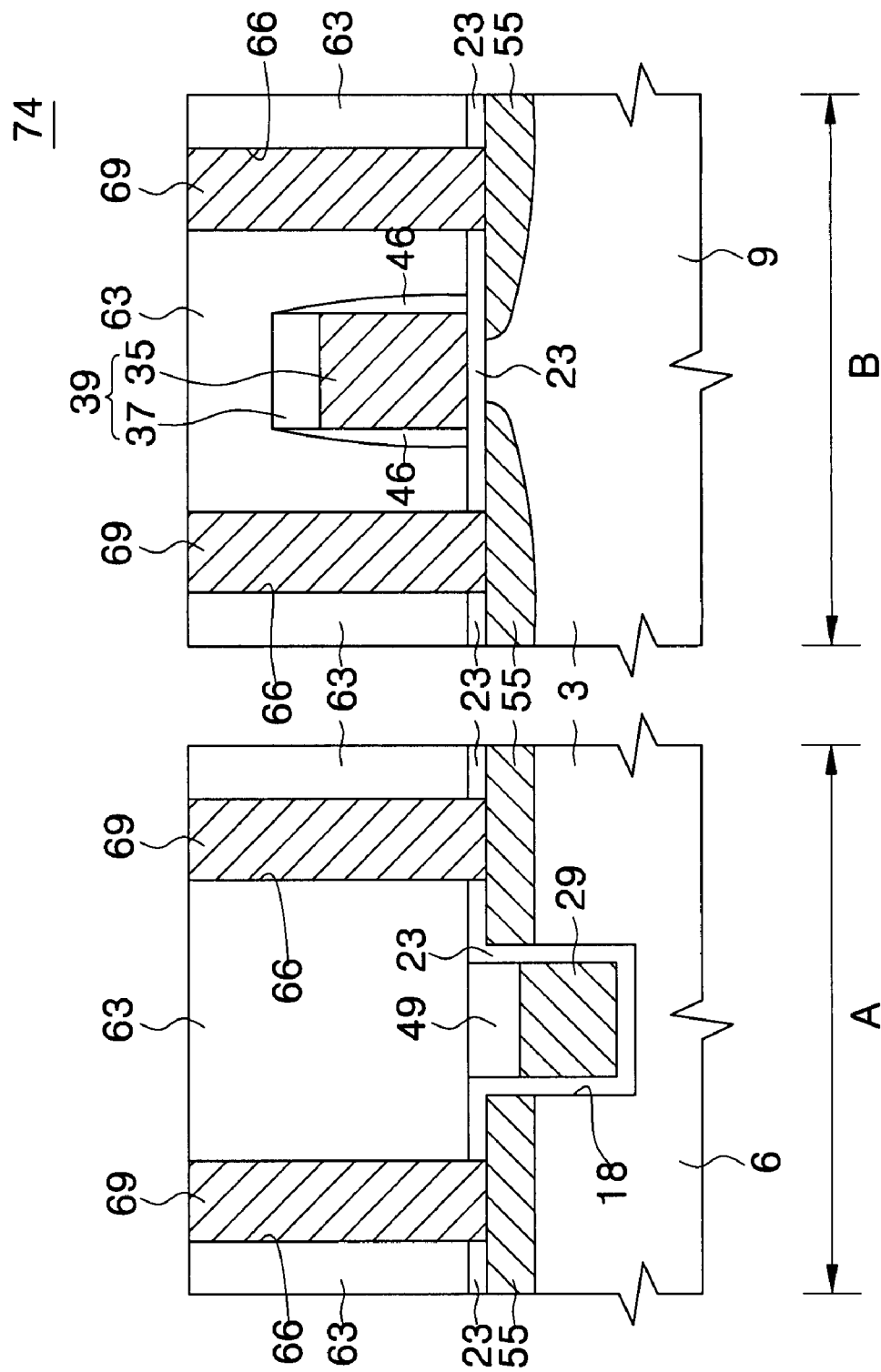

Referring to FIGS. 1 and 13, the gate isolation layer 43 may be blanket-etched to simultaneously form a gate isolation pattern 49 and gate spacers 46 as shown in FIG. 13. The gate spacers 46 and the gate isolation pattern 49 may expose the gate insulating layer 23. The gate isolation pattern 49 may be formed on an upper surface of the buried gate 29. The gate isolation pattern 49 may be formed at substantially the same level as an upper surface of the gate insulating layer 23. The gate spacers 46 may be formed on sidewalls of the gate pattern 39, respectively.

Using the gate pattern 39, the gate spacers 46 and the gate isolation pattern 49 as masks, impurity ions may be implanted into the semiconductor substrate 3, and thereby diffusion regions 55 may be formed as shown in FIG. 13. The diffusion regions 55 may have a different type conductivity from the semiconductor substrate 3. The diffusion regions 55 may have the same type conductivity as the semiconductor substrate 3. The diffusion regions 55 may overlap the buried gate 29 and the gate pattern 39. A planarization insulating layer 63 may be formed on the gate insulating layer 23 to cover the gate pattern 39, the gate spacers 46 and the gate isolation pattern 49 as shown in FIG. 13. The planarization insulating layer 63 may be formed of silicon oxide. The planarization insulating layer 63 may be formed of a material having at least one of metal and non-metal atoms in a lattice of silicon oxide.

Referring back to FIGS. 1 and 13, contact holes 66 penetrating the planarization insulating layer 63 and the gate insulating layer 23 in sequence may be formed adjacent to the buried gate 29 and the gate pattern 39 as shown in FIG. 1 or 13. Electrical nodes 69 may fill the contact holes 66, respectively. The electrical nodes 69 may contact the diffusion regions 55, respectively. The electrical nodes 69 may be formed of conductive material. The electrical nodes 69, the diffusion regions 55, the gate pattern 39 and the buried gate 29 may form transistors 74 respectively in the first and second active regions 6 and 9 as shown in FIG. 1 or 13.

Example embodiments of a method of forming the semiconductor integrated circuit interconnection will be described with reference to FIGS. 6, 8, 10, 12 and 14. FIGS. 6, 8, 10, 12 and 14 respectively are cross-sectional views taken along line II-II' of FIG. 2, illustrating a method of forming a semiconductor integrated circuit interconnection according to example embodiments.

Figure 6:
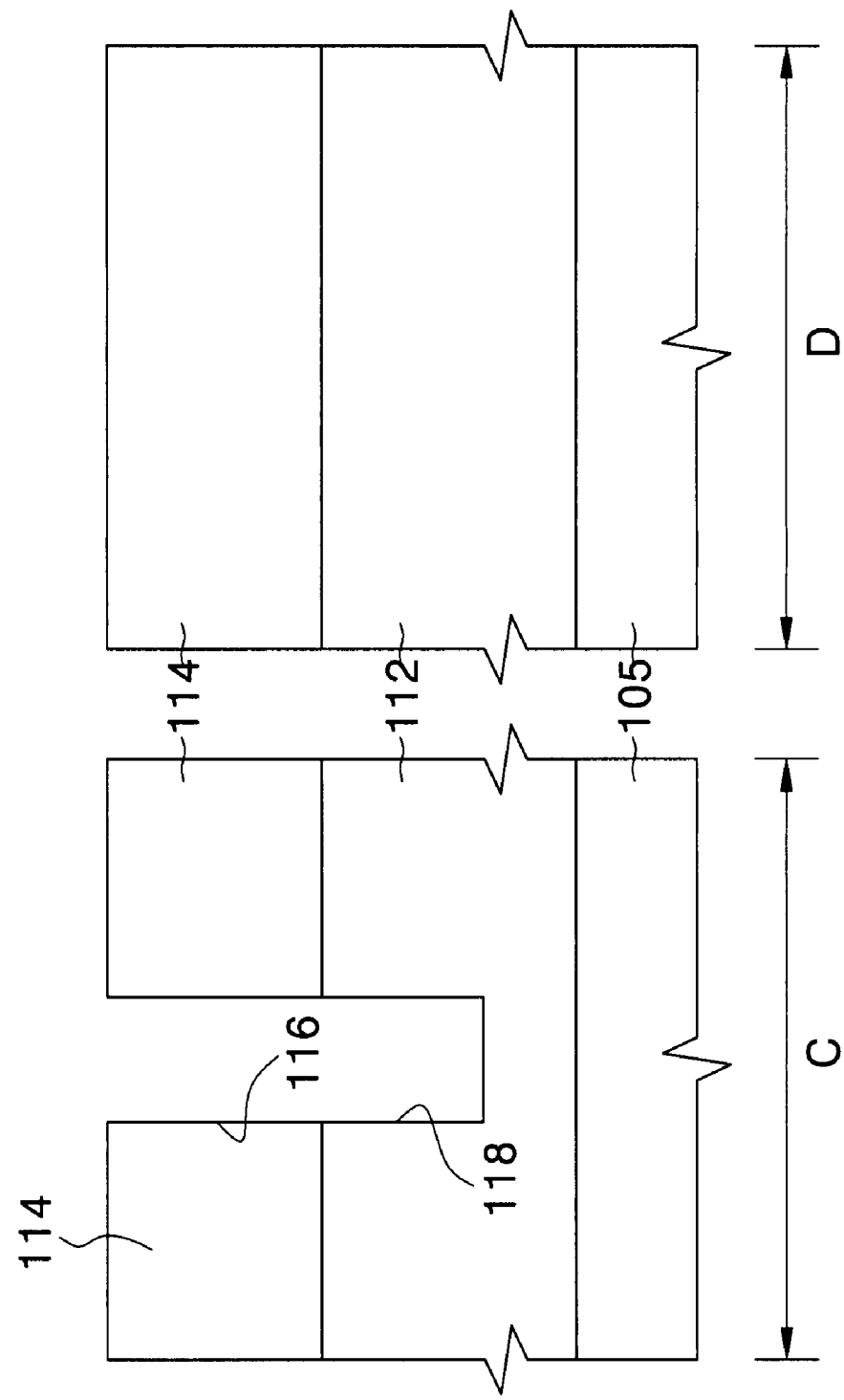

Referring to FIGS. 2 and 6, a semiconductor substrate 105 having first and second regions C and D may be prepared as shown in FIG. 1 or 6. The semiconductor substrate 105 may have N or P-type conductivity. The first and second regions C and D may be a cell array region and a peripheral circuit region, respectively. The first and second regions C and D may be formed adjacent to each other along a boundary of an upper surface of the semiconductor substrate 105.

Referring back to FIGS. 2 and 6, a molding layer 112 and a sacrificial layer 114 may be sequentially formed on the first and second regions C and D as shown in FIG. 6. The sacrificial layer 114 may have a hole 116 on a selected portion of the first region C. The sacrificial layer 114 may be formed of material having a different etch rate from the molding layer 112. The sacrificial layer 114 may be formed of photoresist. The molding layer 112 may be formed of silicon oxide. The molding layer 112 may be formed of material having at least one of metal and non-metal atoms in a lattice of silicon oxide. Using the sacrificial layer 114 as an etching mask, the molding layer 112 may be etched, and thereby a molding trench 118 may be formed as shown in FIG. 1 or 6.

In order to form the molding trench 118, the molding layer 112 and the sacrificial layer 114 may be formed of silicon oxide and silicon nitride, respectively. The molding layer 112 may be formed of a material having at least one of metal and non-metal atoms in a lattice of silicon oxide. A photoresist layer may be formed on the sacrificial layer 114. The photoresist layer may have a through portion on the selected portion of the first region C. The through portion may expose the molding layer 112. The through portion of the photoresist layer may be formed by using a well-known semiconductor photolithography process.

Using the photoresist layer as an etching mask and the molding layer 112 as an etch-stop layer, the sacrificial layer 114 may be etched, which allows the sacrificial layer 114 to have the hole 116 as shown in FIG. 6. The photoresist layer may be removed from the semiconductor substrate 105. Using the sacrificial layer 114 as an etching mask, the molding layer 112 may be etched, so that the molding trench 118 may be formed. The molding trench 118 may be disposed in the selected portion of the first region C and may be formed to extend downward to a predetermined or given depth from an upper surface of the molding layer 112.

Figure 8:
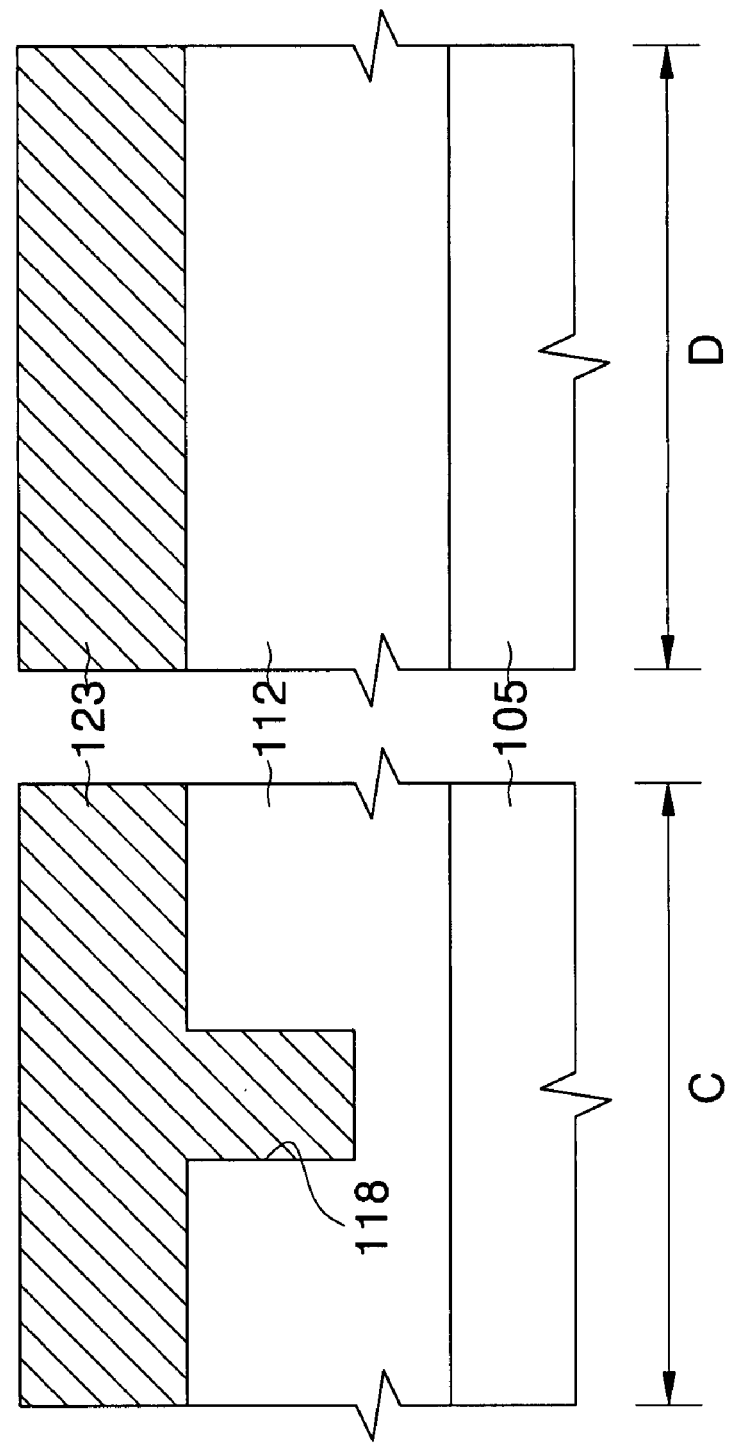

Referring to FIGS. 2 and 8, the sacrificial layer 114 may be removed from the first and second regions C and D. A buried interconnection layer 123 may fill the molding trench 118 and may cover the molding layer 112. The buried interconnection layer 123 may be formed of conductive material. The buried interconnection layer 123 may be formed of doped polysilicon, metal nitride and/or a combination thereof.

Figure 10:
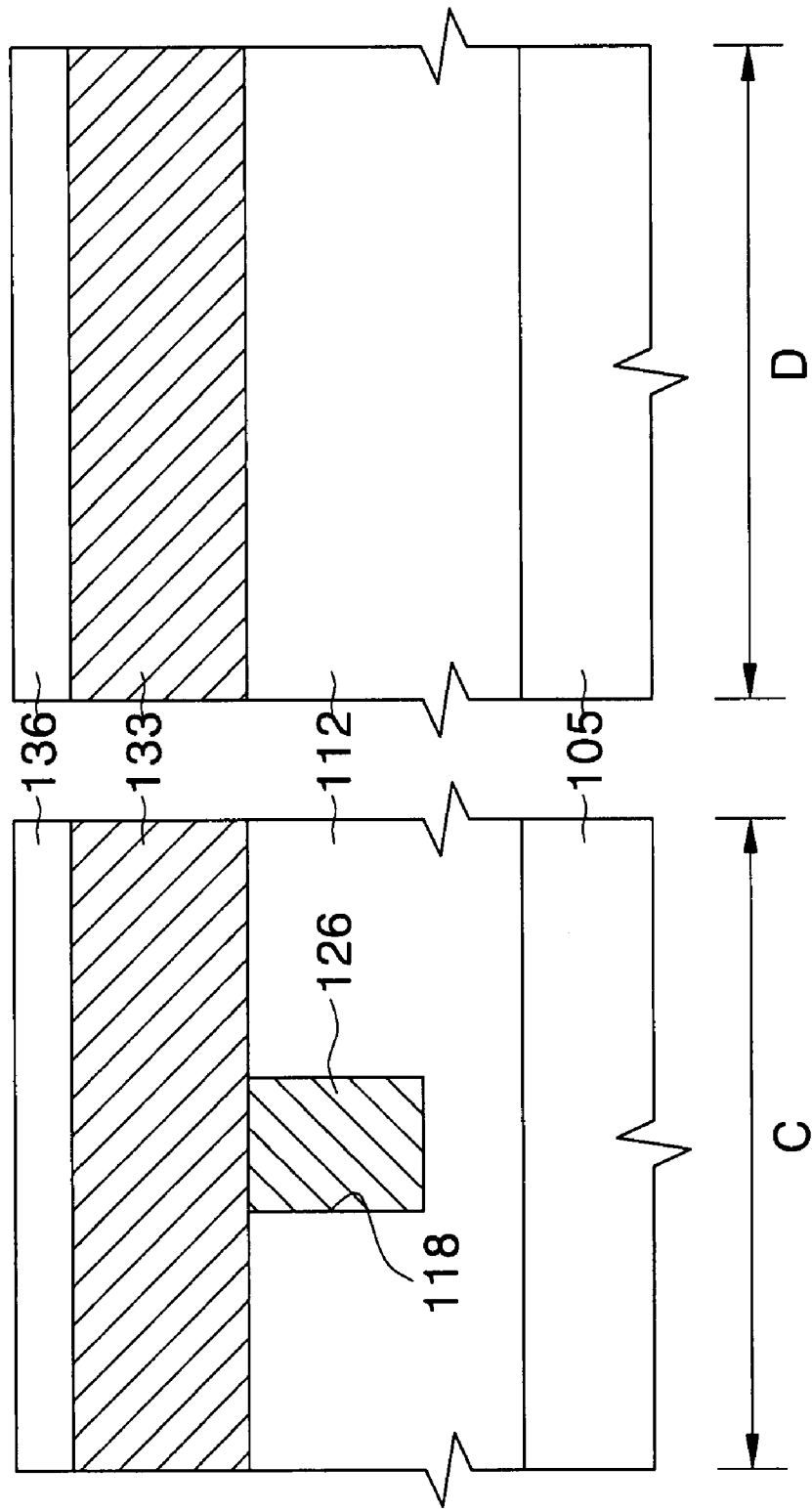

Referring to FIGS. 2 and 10, the buried interconnection layer 123 may be blanket-etched until the molding layer 112 is exposed, and thereby a preliminary buried interconnection 126 may be formed as shown in FIG. 10. The preliminary buried interconnection 126 may sufficiently fill the molding trench 118. An interconnection conductive layer 133 and an interconnection mask layer 136, which are sequentially stacked on the first and second regions C and D, may cover the preliminary buried interconnection 126. The interconnection mask layer 136 may be formed of silicon oxide and/or silicon nitride. The interconnection mask layer 136 may be formed of a material having at least one of metal and non-metal atoms in a lattice of silicon oxide. The interconnection conductive layer 133 may be formed of a conductive material. The interconnection conductive layer 133 may be formed of doped polysilicon, metal nitride and/or a combination thereof.

Figure 12:
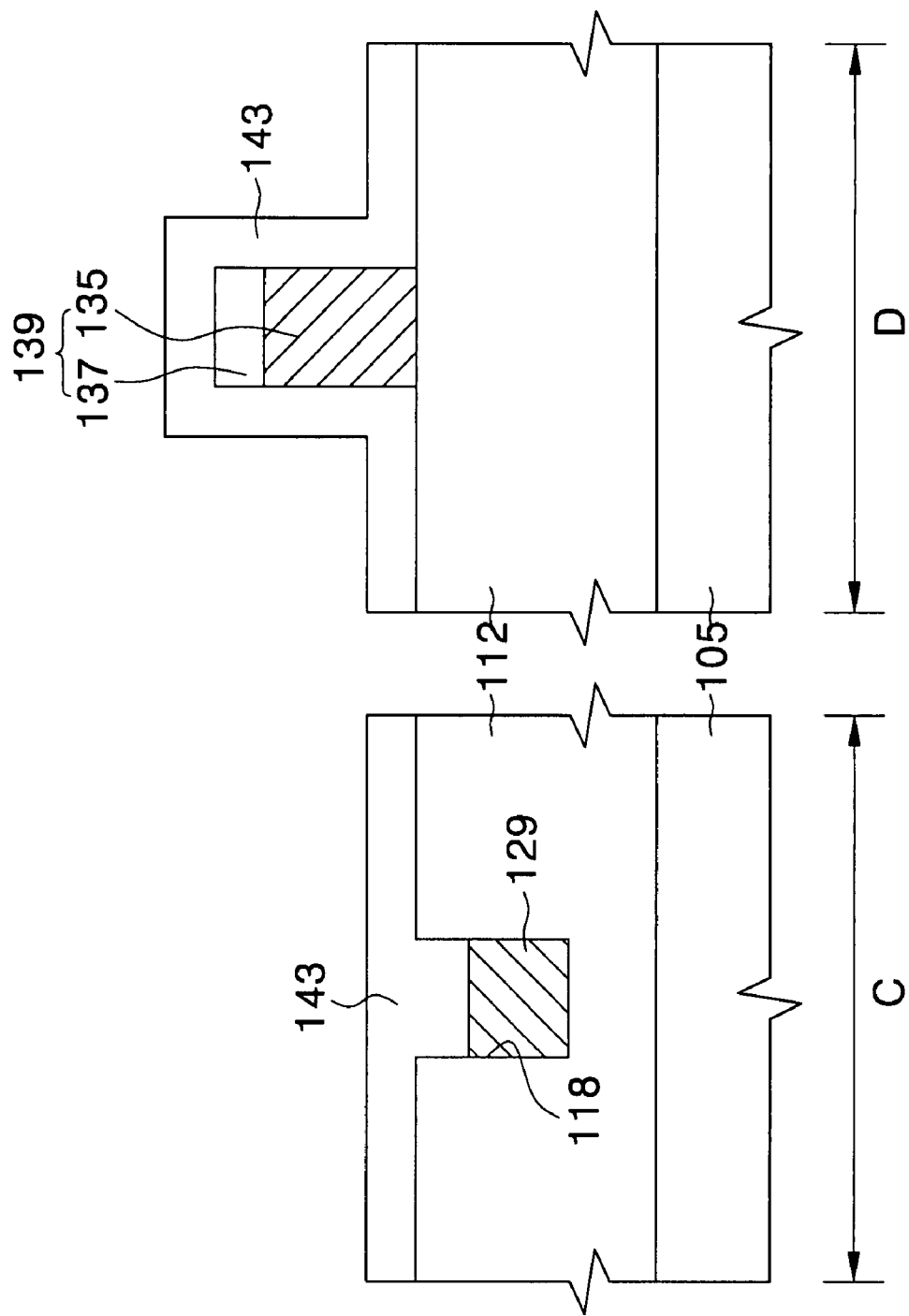

Referring to FIGS. 2 and 12, a photoresist pattern may be formed on the interconnection mask layer 136 to be disposed on a selected portion of the second region D. The photoresist pattern may be formed by a well-known semiconductor photolithography process. Using the photoresist pattern as an etching mask, the interconnection mask layer 136 and the interconnection conductive layer 133 may be sequentially etched until the molding layer 112 is exposed. While the interconnection mask layer 136 and the interconnection conductive layer 133 are etched, the preliminary buried interconnection 126 may be simultaneously and partially etched to form a buried interconnection 129 as shown in FIG. 2 or 12. The buried interconnection 129 may partially fill the molding trench 118. The photoresist pattern may be removed from the semiconductor substrate 105.

An interconnection pattern 139 may be formed on the second region D with the buried interconnection 129 as shown in FIG. 2 or 12. The interconnection pattern 139 may be formed on the selected portion of the second region D and may extend upward from an upper surface of the molding layer 112. The interconnection pattern 139 may have an interconnection electrode 135 and an interconnection mask pattern 137 which are sequentially stacked. The interconnection electrode 135 and the buried interconnection 129 may be formed of different conductive materials. Alternatively, the interconnection electrode 135 and the buried interconnection 129 may be formed of the same conductive material. An interconnection isolation layer 143 may be formed on the molding layer 112 to cover the buried interconnection 129 and the interconnection pattern 139. The interconnection isolation layer 143 may be formed of silicon oxide and/or silicon nitride.

Figure 14:
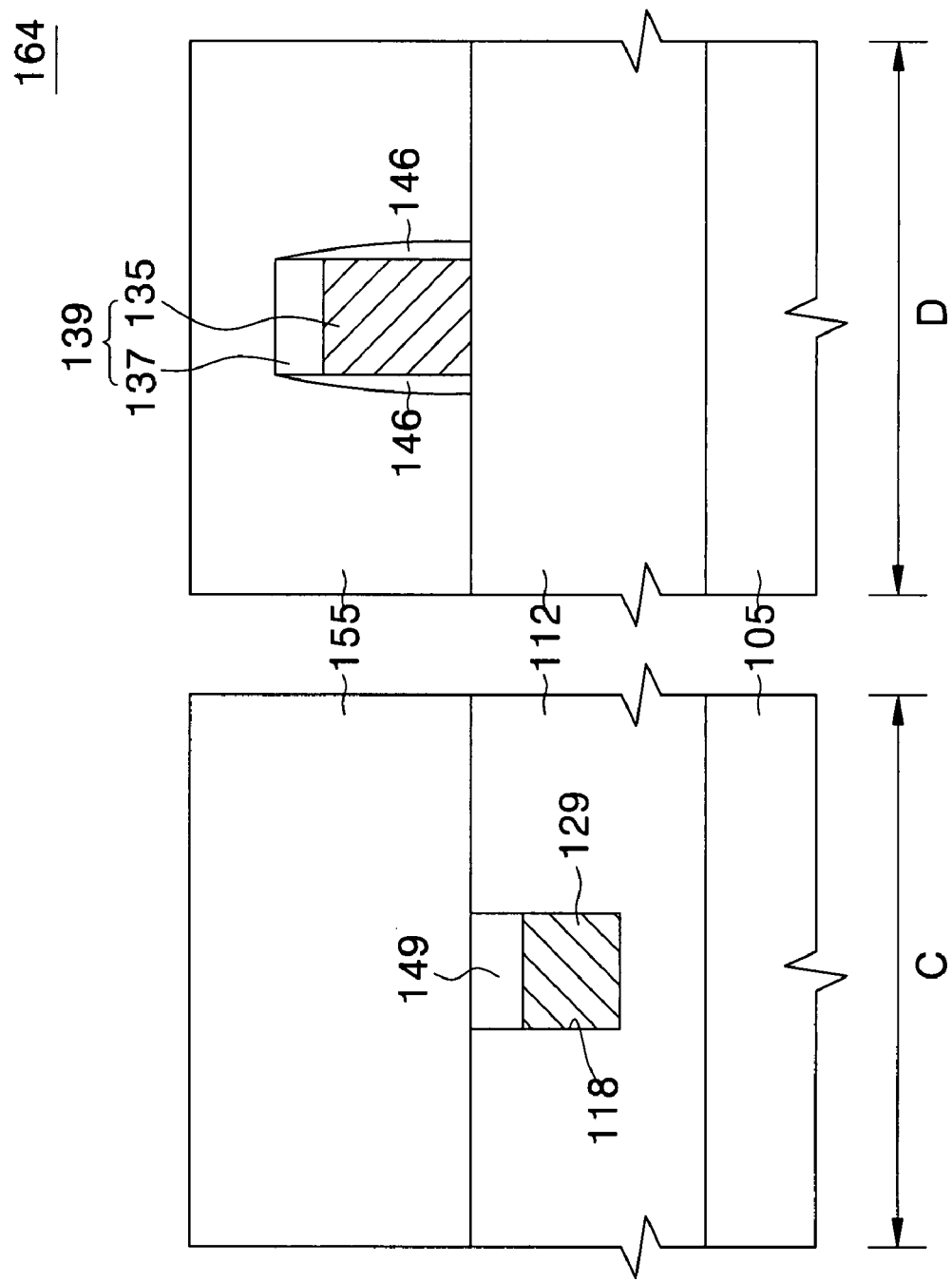

Referring to FIGS. 2 and 14, the interconnection isolation layer 143 may be blanket-etched, and thereby an interconnection isolation pattern 149 and interconnection spacers 146 may be simultaneously formed as shown in FIG. 14. The interconnection spacers 146 and the interconnection isolation pattern 149 may expose the molding layer 112. The interconnection isolation pattern 149 may be formed on an upper surface of the buried interconnection 129. The interconnection isolation pattern 149 may be formed at substantially the same level as the upper surface of the molding layer 112. The interconnection spacers 146 may be formed on sidewalls of the interconnection pattern 139, respectively. A passivation insulating layer 155 may be formed on the molding layer 112 to cover the interconnection isolation pattern 149, the interconnection spacers 146 and the interconnection pattern 139 as shown in FIG. 14. The passivation insulating layer 155 may be formed of silicon oxide. The passivation insulating layer 155 may be formed of a material having at least one of metal and non-metal atoms in a lattice of silicon oxide. The interconnection pattern 139 and the buried interconnection 129 may form the semiconductor integrated circuit interconnections 164 respectively in the first and second regions C and D as shown in FIG. 1 or 14.

Figure 15:
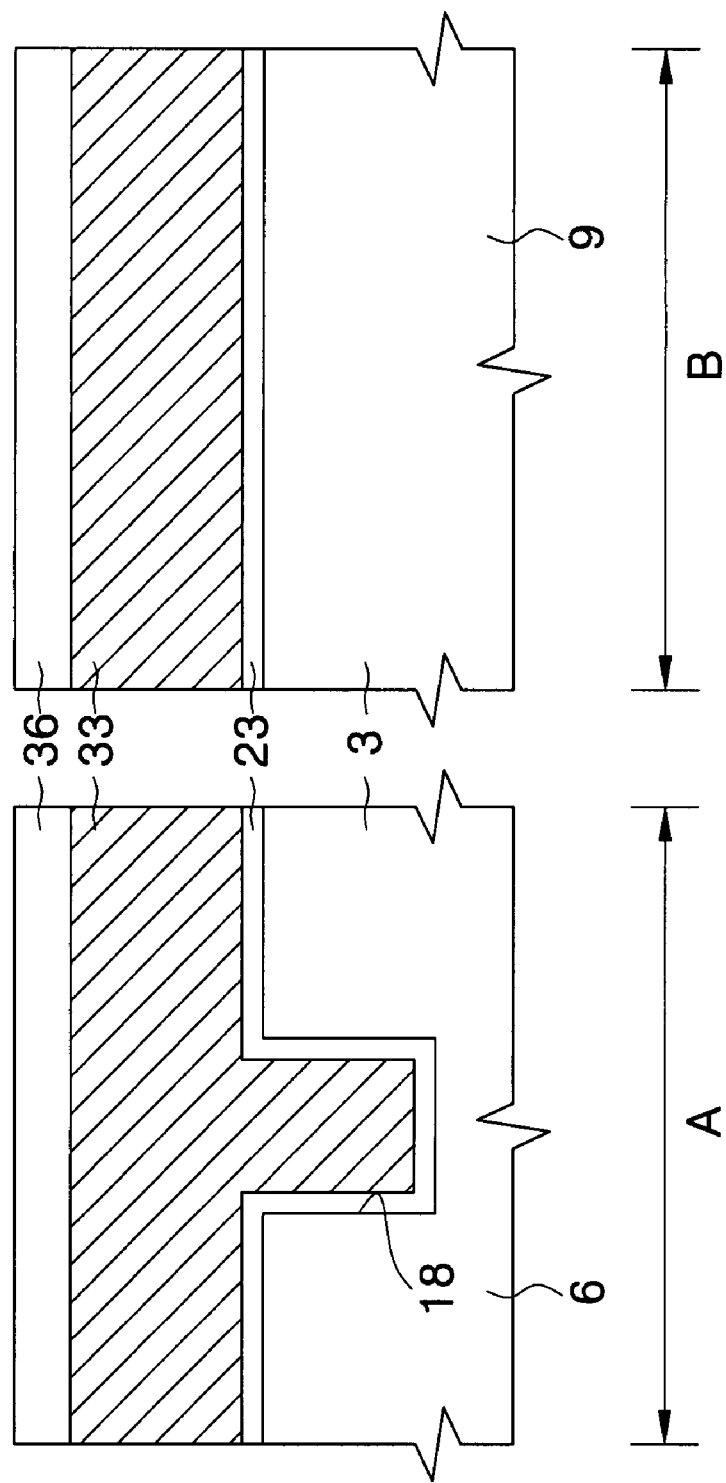
Figure 17:
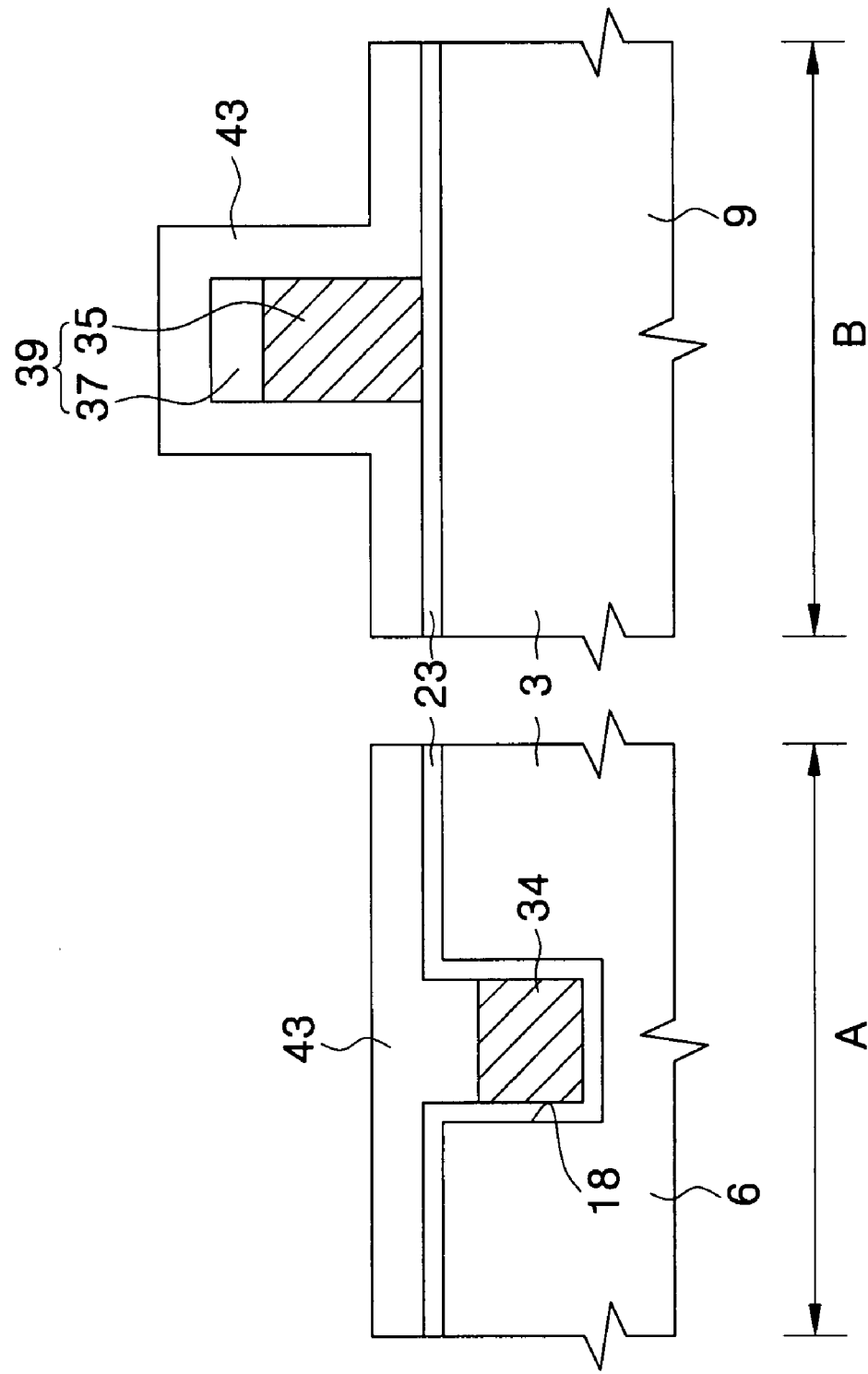
Figure 19:
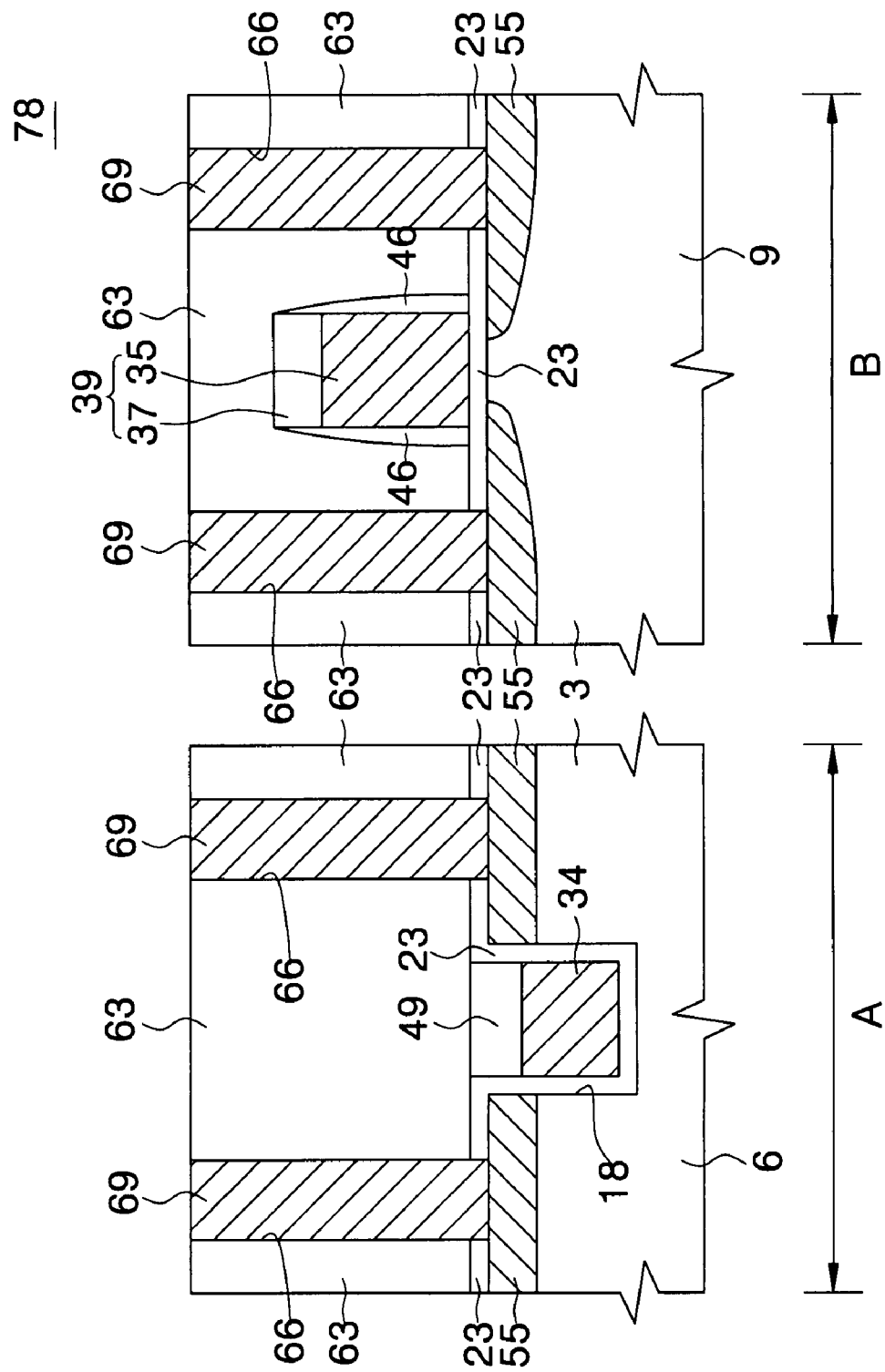

FIGS. 15, 17 and 19 respectively are cross-sectional views taken along line I-I' of FIG. 1, illustrating a method of forming a transistor according to example embodiments. Example embodiments may be described on the basis of FIG. 5. The same reference numeral as in FIG. 5 indicates the same material.

Referring to FIGS. 1, 5 and 15, after the channel trench 18 is formed in the selected portion of the first active region 6 of the semiconductor substrate 3 as shown in FIG. 1 or 5, the buffer layer 14 and the pad layer 12 may be sequentially removed from the first and second active regions 6 and 9 of the semiconductor substrate 3. A gate insulating layer 23 may be formed on the first and second active regions 6 and 9 as shown in FIG. 15. The gate insulating layer 23 may cover the channel trench 18. A gate conductive layer 33 and a gate mask layer 36 may be sequentially formed on the gate insulating layer 23. The gate conductive layer 33 may fill the channel trench 18.

Referring to FIGS. 1 and 17, a photoresist pattern may be formed on the gate mask layer 36 to be disposed on the selected portion of the second active region 9. The photoresist pattern may be formed by using a well-known semiconductor photolithography process. Using the photoresist pattern as an etching mask, the gate mask layer 36 and the gate conductive layer 33 may be sequentially etched until the gate insulating layer 23 is exposed, and thereby a gate pattern 39 may be formed as shown in FIG. 1 or 17.

The gate pattern 39 may have a gate electrode 35 and a gate mask pattern 37 which are sequentially stacked. A buried gate 34 may partially fill the channel trench 18 using the gate conductive layer 33 as shown in FIG. 1 or 17, while the gate pattern 39 is formed. The buried gate 34 and the gate electrode 35 may be formed of the same conductive material. Thus, the gate electrode 35 and the buried gate 34 may further simplify the fabrication process of the transistors 74 according to example embodiments. The photoresist pattern may be removed from the semiconductor substrate 3. A gate isolation layer 43 may be formed on the gate insulating layer 23 to cover the buried gate 34 and the gate pattern 39.

Referring to FIGS. 1 and 19, the gate isolation layer 43 may be blanket-etched, and thereby a gate isolation pattern 49 and gate spacers 46 may be simultaneously formed as shown in FIG. 19. The gate spacers 46 and the gate isolation pattern 49 may expose the gate insulating layer 23. The gate isolation pattern 49 may be formed on an upper surface of the buried gate 34. The gate isolation pattern 49 may be formed at substantially the same level as an upper surface of the gate insulating layer 23. The gate spacers 46 may be formed on sidewalls of the gate pattern 39, respectively. Using the gate pattern 39, the gate spacers 46, and the gate isolation pattern 49 as masks, impurity ions may be implanted into the semiconductor substrate 3, and thereby diffusion regions 55 may be formed as shown in FIG. 19. The diffusion regions 55 may overlap the buried gate 34 and the gate pattern 39. A planarization insulating layer 63 may be formed on the gate insulating layer 23 to cover the gate pattern 39, the gate spacers 46, and the gate isolation pattern 49 as shown in FIG. 19.

Referring back to FIGS. 1 and 19, contact holes 66 penetrating the planarization insulating layer 63 and the gate insulating layer 23 in sequence may be formed adjacent to the buried gate 34 and the gate pattern 39 as shown in FIG. 1 or 19. Electrical nodes 69 filling the contact holes 66 may be formed. The electrical nodes 69 may contact the diffusion regions 55, respectively. Thus, the buried gate 34, the gate pattern 39, the diffusion regions 55 and electrical nodes 69 may form transistors 78 respectively in the first and second active regions 6 and 9 as shown in FIG. 1 or 19.

Figure 16:
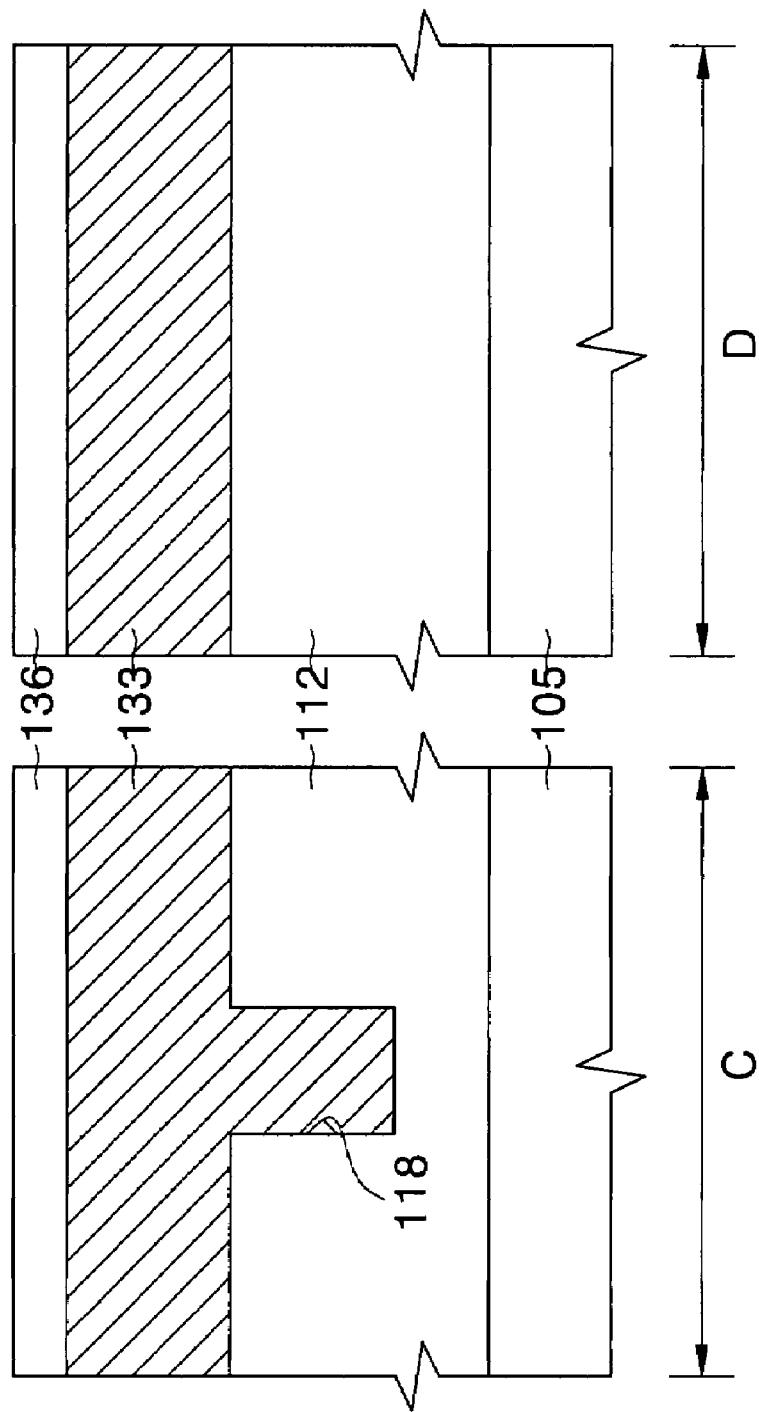
Figure 18:
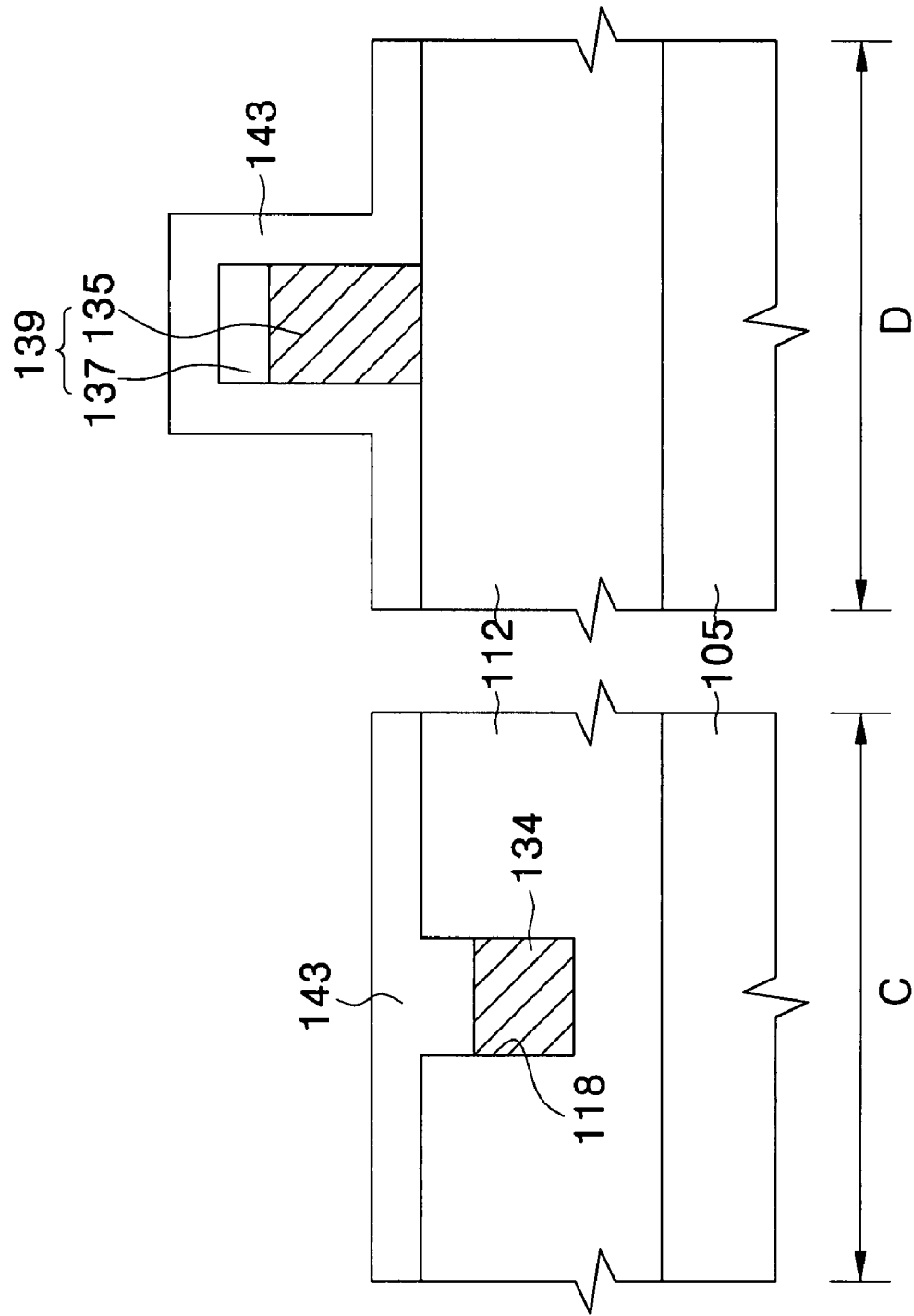

FIGS. 16, 18 and 20 respectively are cross-sectional views taken along line II-II' of FIG. 2, illustrating a method of forming a semiconductor integrated circuit interconnection according to example embodiments. Example embodiments may be described on the basis of FIG. 6. The same reference numeral as in FIG. 6 indicates the same material.

Referring to FIGS. 2, 6 and 16, after the molding trench 118 is formed in the selected portion of the first region C of the semiconductor substrate 105 as shown in FIG. 2 or 6, the sacrificial layer 114 may be removed from the first and second regions C and D of the semiconductor substrate 105. An interconnection conductive layer 133 and an interconnection mask layer 136 may be sequentially formed on the molding layer 112 as shown in FIG. 16. The interconnection conductive layer 133 may fill the molding trench 118.

Referring to FIGS. 2 and 18, a photoresist pattern may be formed on the interconnection mask layer 136 to be disposed on the selected portion of the second region D. The photoresist pattern may be formed by using a well-known semiconductor photolithography process. Using the photoresist pattern as an etching mask, the interconnection mask layer 136 and the interconnection conductive layer 133 may be sequentially etched until the molding layer 112 is exposed, and thereby an interconnection pattern 139 may be formed as shown in FIG. 2 or 18.

The interconnection pattern 139 may have an interconnection electrode 135 and an interconnection mask pattern 137 which are sequentially stacked. A buried interconnection 134 may partially fill the molding trench 118 using the interconnection conductive layer 133 as shown in FIG. 2 or 18. The buried interconnection 134 and the interconnection electrode 135 may be formed of the same conductive material. The interconnection electrode 135 and the buried interconnection 134 may further simplify the semiconductor fabrication process of the semiconductor integrated circuit interconnections 164 according to example embodiments. The photoresist pattern may be removed from the semiconductor substrate 105. An interconnection isolation layer 143 may be formed on the molding layer 112 to cover the buried interconnection 134 and the interconnection pattern 139.

Referring to FIGS. 2 and 20, the interconnection isolation layer 143 may be blanket-etched, and thereby an interconnection isolation pattern 149 and interconnection spacers 146 may be simultaneously formed as shown in FIG. 20. The interconnection spacers 146 and the interconnection isolation pattern 149 may expose the molding layer 112. The interconnection isolation pattern 149 may be formed on an upper surface of the buried interconnection 134. The interconnection isolation pattern 149 may be formed at substantially the same level as an upper surface of the molding layer 112. The interconnection spacers 146 may be formed on sidewalls of the interconnection pattern 139, respectively. A passivation insulating layer 155 may be formed on the molding layer 112 to cover the interconnection pattern 139 and the interconnection isolation pattern 149. The buried interconnection 134 and the interconnection pattern 139 may form semiconductor integrated circuit interconnections 168 respectively in the first and second regions C and D as shown in FIG. 1 or 20.

As described above, example embodiments provide transistors, semiconductor integrated circuit interconnections, and methods of forming the same. According to the transistors, semiconductor integrated circuit interconnections, and methods of forming the same, current driving capability and current transmission capability may be improved, and a semiconductor fabrication process may be simplified.

Example embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the following claims.

What is claimed is:

1. A transistor comprising:
   a semiconductor substrate having first and second active regions;
   a buried gate in a selected portion of the first active region of the semiconductor substrate and being spaced by a depth from an upper surface of the semiconductor substrate and extending downward to the semiconductor substrate;
   a gate pattern on a selected portion of the second active region of the semiconductor substrate and extending upward from the upper surface of the semiconductor substrate;
   a gate insulating layer on the first and second active regions, encompassing the buried gate, and between the gate pattern and the semiconductor substrate;
   a gate isolation pattern covering an upper surface of the buried gate and at substantially the same level as an upper surface of the gate insulating layer; and
   gate spacers on sidewalls of the gate pattern,
   wherein the gate pattern includes a gate electrode and a gate mask pattern which are sequentially stacked.

2. The transistor according to claim 1, wherein the gate electrode and the buried gate include the same conductive material.

3. The transistor according to claim 1, wherein the gate electrode includes different conductive material from the buried gate.

4. The transistor according to claim 1, wherein the gate mask pattern, the gate spacers, and the gate isolation pattern include the same material.

5. The transistor according to claim 1, wherein the gate mask pattern, the gate spacers, and the gate isolation pattern include different materials from one another.

6. The transistor according to claim 1, wherein the gate insulating layer includes material having at least one of metal and non-metal atoms in a lattice of silicon oxide.

7. The transistor according to claim 1, further comprising:
   diffusion regions in the semiconductor substrate to overlap the buried gate and the gate pattern;
   a planarization insulating layer on the gate insulating layer to cover the gate pattern, the gate isolation pattern, and the gate spacers; and
   electrical nodes penetrating the planarization insulating layer and the gate insulating layer in sequence to be adjacent to the buried gate and the gate pattern, and contacting the diffusion regions.

8. A semiconductor integrated circuit interconnection comprising:
   a semiconductor substrate having first and second regions;
   a molding layer on the first and second regions of the semiconductor substrate;
   a buried interconnection in the molding layer of a selected portion of the first region and being spaced by a depth from an upper surface of the molding layer and extending downward to the semiconductor substrate;
   an interconnection pattern on the molding layer of a selected portion of the second region and extending upward from the upper surface of the molding layer;
   an interconnection isolation pattern covering an upper surface of the buried interconnection and at substantially the same level as the upper surface of the molding layer; and
   interconnection spacers on sidewalls of the interconnection pattern,
   wherein the interconnection pattern includes an interconnection electrode and an interconnection mask pattern which are sequentially stacked.

9. The semiconductor integrated circuit interconnection according to claim 8, wherein the interconnection electrode and the buried interconnection include the same conductive material.

10. The semiconductor integrated circuit interconnection according to claim 8, wherein the interconnection electrode includes different conductive material from the buried interconnection.

11. The semiconductor integrated circuit interconnection according to claim 8, wherein the interconnection mask pattern, the interconnection spacers, and the interconnection isolation pattern include the same conductive material.

12. The semiconductor integrated circuit interconnection according to claim 8, wherein the interconnection mask pattern, the interconnection spacers, and the interconnection isolation pattern include different conductive materials form one another.

13. The semiconductor integrated circuit interconnection according to claim 8, wherein the molding layer includes material having at least one of metal and non-metal atoms in a lattice of silicon oxide.

14. A method of forming a transistor, comprising:
   preparing a semiconductor substrate having first and second active regions;
   forming a channel trench in a selected portion of the first active region of the semiconductor substrate and extending downward to a depth from an upper surface of the semiconductor substrate;
   forming a gate insulating layer on the first and second active regions;
   forming a buried gate and a gate pattern on the gate insulating layer, the buried gate partially filling the channel trench and the gate pattern being formed on a selected portion of the second active region and extending upward from an upper surface of the gate insulating layer; and forming a gate isolation pattern on an upper surface of the buried gate and gate spacers on sidewalls of the gate pattern, wherein the gate pattern is formed of a gate electrode and a gate mask pattern which are sequentially stacked.

15. The method according to claim 14, wherein forming the gate isolation pattern and the gate spacers includes:

forming a gate isolation layer on the gate insulating layer to cover the buried gate and the gate pattern; and blanket-etching the gate isolation layer to expose the gate insulating layer, wherein the gate isolation pattern is formed at substantially the same level as the upper surface of the gate insulating layer.

16. The method according to claim 15, wherein the gate mask pattern, the gate spacers, and the gate isolation pattern are formed of the same material.

17. The method according to claim 15, wherein the gate mask pattern, the gate spacers, and the gate isolation pattern are formed of different materials from one another.

18. The method according to claim 14, wherein forming the buried gate and the gate pattern includes:

forming a buried gate layer filling the channel trench to cover the gate insulating layer;

blanket-etching the buried gate layer until the gate insulating layer is exposed, and forming a preliminary buried gate to sufficiently fill the channel trench;

forming a gate conductive layer and a gate mask layer which are sequentially stacked on the first and second active regions to cover the preliminary buried gate;

forming a photoresist pattern on the gate mask layer to be formed on the selected portion of the second active region;

sequentially etching the gate mask layer and the gate conductive layer, and simultaneously and partially etching the preliminary buried gate using the photoresist pattern as an etching mask until the gate insulating layer is exposed; and removing the photoresist pattern from the semiconductor substrate.

19. The method according to claim 14, wherein forming the buried gate and the gate pattern includes:

sequentially forming a gate conductive layer and a gate mask layer on the gate insulating layer, the gate conductive layer filling the channel trench;

forming a photoresist pattern on the gate mask layer to be on the selected portion of the second active region;

sequentially etching the gate mask layer and the gate conductive layer using the photoresist pattern as an etching mask until the gate insulating layer is exposed, and simultaneously forming a buried gate to partially fill the channel trench using the gate conductive layer; and removing the photoresist pattern from the semiconductor substrate.

20. The method according to claim 14, wherein forming the channel trench includes:

forming a pad layer and a buffer layer which are sequentially stacked on the first and second active regions, the buffer layer having a hole on the selected portion of the first active region;

sequentially etching the pad layer and the semiconductor substrate using the buffer layer as an etching mask; and sequentially removing the buffer layer and the pad layer from the semiconductor substrate, wherein the pad layer and the buffer layer are formed of material having a different etch rate from the semiconductor substrate.

21. The method according to claim 14, further comprising:

implanting impurity ions into the semiconductor substrate using the gate isolation pattern, the gate pattern, and the gate spacers as a mask, and forming diffusion regions to overlap the buried gate and the gate pattern;

forming a planarization interlayer insulating layer on the gate insulating layer to cover the gate isolation pattern, the gate pattern, and the gate spacers; and forming electrical nodes sequentially penetrating the planarization interlayer insulating layer and the gate insulating layer to be adjacent to the buried gate and the gate pattern and contacting the diffusion regions.

22. A method of forming a semiconductor integrated circuit interconnection, comprising:

preparing a semiconductor substrate having first and second regions;

forming a molding layer on the first and second regions;

forming a molding trench in the molding layer, the molding trench being formed in a selected portion of the first region and extending downward to have a depth from an upper surface of the molding layer;

forming a buried interconnection in the first region and an interconnection pattern on the second region, the buried interconnection partially filling the molding trench, and the interconnection pattern being formed on a selected portion of the second region and extending upward from the upper surface of the molding layer; and forming an interconnection isolation pattern on an upper surface of the buried interconnection and interconnection spacers on sidewalls of the interconnection pattern, wherein the interconnection pattern is formed of an interconnection electrode and an interconnection mask pattern which are sequentially stacked.

23. The method according to claim 22, wherein forming the interconnection isolation pattern and the interconnection spacers includes:

forming an interconnection isolation layer on the molding layer to cover the buried interconnection and the interconnection pattern; and blanket-etching the interconnection isolation layer to expose the molding layer, wherein the interconnection isolation pattern is formed at substantially the same level as the upper surface of the molding layer.

24. The method according to claim 23, wherein the interconnection mask pattern, the interconnection spacers, and the interconnection isolation pattern are formed of the same material.

25. The method according to claim 23, wherein the interconnection mask pattern, the interconnection spacers, and the interconnection isolation pattern are formed of different materials from one another.

26. The method according to claim 22, wherein forming the buried interconnection and the interconnection pattern includes:

forming a buried interconnection layer filling the molding trench and covering the molding layer;

blanket-etching the buried interconnection layer until the molding layer is exposed and forming a preliminary buried interconnection to sufficiently fill the molding trench;

forming an interconnection conductive layer and an interconnection mask layer which are sequentially stacked to cover the preliminary buried interconnection on the first and second regions;

forming a photoresist pattern on the interconnection mask layer to be formed on the selected portion of the second region;

sequentially etching the interconnection mask layer and the interconnection conductive layer, and simultaneously and partially etching the preliminary buried interconnection using the photoresist pattern as an etching mask until the molding layer is exposed; and removing the photoresist pattern from the semiconductor substrate.

27. The method according to claim 22, wherein forming the buried interconnection and the interconnection pattern includes:

sequentially forming an interconnection conductive layer and an interconnection mask layer on the molding layer, the interconnection conductive layer being formed to fill the molding trench;

forming a photoresist pattern on the interconnection mask layer to be formed on the selected portion of the second region;

sequentially etching the interconnection mask layer and the interconnection conductive layer using the photoresist pattern as an etching mask until the molding layer is exposed, and simultaneously forming the buried interconnection to partially fill the molding trench using the interconnection conductive layer; and removing the photoresist pattern from the semiconductor substrate.

28. The method according to claim 22, wherein forming the molding trench includes:

forming a sacrificial layer on the first and second regions to have a hole on the selected portion of the first region;

etching the molding layer using the sacrificial layer as an etching mask; and removing the sacrificial layer from the semiconductor substrate, wherein the sacrificial layer and the molding layer are formed of insulating materials having different etch rates.

* * * * *